United States Patent
Chang et al.

(10) Patent No.: US 11,980,046 B2
(45) Date of Patent: May 7, 2024

(54) METHOD FOR FORMING AN ISOLATION STRUCTURE HAVING MULTIPLE THICKNESSES TO MITIGATE DAMAGE TO A DISPLAY DEVICE

(71) Applicant: Taiwan Semiconductor Manufacturing Co., Ltd., Hsin-Chu (TW)

(72) Inventors: Yung-Chang Chang, Taipei (TW); Ming Chyi Liu, Hsinchu (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 0 days.

(21) Appl. No.: 16/884,375

(22) Filed: May 27, 2020

(65) Prior Publication Data
US 2021/0376282 A1   Dec. 2, 2021

(51) Int. Cl.
*H10K 50/818*   (2023.01)
*H10K 50/828*   (2023.01)
(Continued)

(52) U.S. Cl.
CPC ......... *H10K 50/818* (2023.02); *H10K 50/828* (2023.02); *H10K 59/122* (2023.02); *H10K 59/124* (2023.02); *H10K 59/12* (2023.02)

(58) Field of Classification Search
CPC ............ H01L 51/5209; H01L 51/5212; H01L 51/5215; H01L 51/5218; H01L 33/465;
(Continued)

(56) References Cited

U.S. PATENT DOCUMENTS

| | | | |
|---|---|---|---|
| 4,538,143 A | | 8/1985 | Ito |
| 5,213,984 A | * | 5/1993 | Okada ............... H01L 27/14643 216/79 |

(Continued)

FOREIGN PATENT DOCUMENTS

| | | | |
|---|---|---|---|
| GB | 2570580 A | | 7/2019 |
| KR | 20090003590 A | * | 1/2009 |

OTHER PUBLICATIONS

Waechtler et al. "Optical Properties of Sputtered Tantalum Nitride Films Determined by Spectroscopic Ellipsometry." Oral contributed presentation; 4th Workshop Ellipsometry, Feb. 20-22, 2006, Berlin, Germany, published Mar. 16, 2006.
(Continued)

*Primary Examiner* — Sophia T Nguyen
(74) *Attorney, Agent, or Firm* — Eschweiler & Potashnik, LLC

(57) ABSTRACT

In some embodiments, the present disclosure relates to a display device that includes a first reflector electrode and a second reflector electrode that is separated from the first reflector electrode. The display device further includes an isolation structure that overlies the first and second reflector electrodes. The isolation structure includes a first and second portion. The first portion overlies the first reflector electrode and has a first thickness. The second portion overlies the second reflector electrode, has a second thickness greater than the first thickness, and is separated from the first portion of the isolation structure. The display device also includes a first optical emitter structure and a second optical emitter structure that respectively overlie the first portion and the second portion of the isolation structure.

17 Claims, 11 Drawing Sheets

(51) Int. Cl.
*H10K 59/122* (2023.01)
*H10K 59/124* (2023.01)
*H10K 59/12* (2023.01)

(58) Field of Classification Search
CPC ............. H01L 27/3246; H01L 27/3248; H01L 27/3276–3279; H01L 27/3258; H01L 27/3211; H01L 27/3218; H01L 27/3216; H01L 27/3238; H10K 59/124; H10K 59/123; H10K 59/35; H10K 59/353; H10K 59/352; H10K 59/122; H10K 50/852; H10K 50/856; H10K 50/816; H10K 50/814; H10K 50/818; H10K 50/81

See application file for complete search history.

(56) References Cited

U.S. PATENT DOCUMENTS

| | | | | |
|---|---|---|---|---|
| 6,392,340 B2* | 5/2002 | Yoneda | ............... | H10K 59/38 |
| | | | | 313/506 |
| 6,414,738 B1* | 7/2002 | Fujikawa | ............ | G02F 1/13454 |
| | | | | 349/147 |
| 6,737,800 B1* | 5/2004 | Winters | ............... | C09K 11/06 |
| | | | | 313/504 |
| 6,911,772 B2* | 6/2005 | Cok | ............... | H10K 59/35 |
| | | | | 313/506 |
| 7,719,182 B2* | 5/2010 | Cok | ............... | H10K 50/856 |
| | | | | 313/506 |
| 7,741,770 B2* | 6/2010 | Cok | ............... | H01L 27/322 |
| | | | | 313/503 |
| 7,812,519 B2* | 10/2010 | Chang | ............... | H01L 27/3211 |
| | | | | 313/504 |
| 7,855,508 B2* | 12/2010 | Cok | ............... | H01L 27/3206 |
| | | | | 313/506 |
| 7,859,188 B2* | 12/2010 | Cok | ............... | H01L 27/322 |
| | | | | 313/506 |
| 7,868,543 B2* | 1/2011 | Kobayashi | ............ | H10K 50/856 |
| | | | | 313/506 |
| 7,888,858 B2* | 2/2011 | Cok | ............... | H01L 51/5268 |
| | | | | 313/506 |
| 7,923,920 B2* | 4/2011 | Nakamura | ............ | H10K 50/856 |
| | | | | 313/506 |
| 8,207,668 B2* | 6/2012 | Cok | ............... | H01L 27/322 |
| | | | | 313/506 |
| 8,237,360 B2* | 8/2012 | Kinoshita | ............ | H01L 51/5265 |
| | | | | 313/506 |
| 8,253,127 B2* | 8/2012 | Kang | ............... | H05B 33/10 |
| | | | | 257/40 |
| 8,816,579 B2 | 8/2014 | Kim | | |
| 8,847,215 B2* | 9/2014 | Park | ............... | H01L 51/5265 |
| | | | | 257/40 |
| 8,895,967 B2* | 11/2014 | Kim | ............... | H01L 27/3251 |
| | | | | 257/40 |
| 8,933,471 B2 | 1/2015 | Kurata et al. | | |
| 9,048,369 B2* | 6/2015 | Sato | ............... | H01L 27/3262 |
| 9,059,424 B2* | 6/2015 | Ko | ............... | H01L 51/5218 |
| 9,343,515 B2* | 5/2016 | Sugisawa | ............ | H01L 27/3246 |
| 9,653,520 B2* | 5/2017 | Kim | ............... | H01L 27/3213 |
| 9,660,219 B2* | 5/2017 | Shin | ............... | H10K 50/81 |
| 9,954,035 B2* | 4/2018 | Yang | ............... | H10K 50/818 |
| 10,032,831 B2* | 7/2018 | Matsumoto | ......... | H01L 27/3218 |
| 10,135,032 B2* | 11/2018 | Aiba | ............... | H01L 51/5265 |
| 10,403,695 B2* | 9/2019 | Bang | ............... | H01L 51/5212 |
| 10,431,774 B2* | 10/2019 | Lai | ............... | H01L 51/5218 |
| 10,797,113 B2* | 10/2020 | Ohsawa | ............ | H01L 51/5265 |
| 10,916,589 B2* | 2/2021 | Bang | ............... | H01L 51/5237 |
| 10,930,708 B2* | 2/2021 | Quan | ............... | H01L 51/5218 |
| 10,943,817 B2* | 3/2021 | Yeoh | ............... | H01L 23/53209 |
| 11,005,063 B2* | 5/2021 | Liu | ............... | H01L 51/56 |
| 11,024,774 B2* | 6/2021 | Chang | ............... | H01L 33/405 |
| 11,069,873 B2* | 7/2021 | Chang | ............... | H01L 51/5271 |
| 11,189,815 B2* | 11/2021 | Kim | ............... | H01L 51/5271 |
| 11,362,145 B2* | 6/2022 | Kim | ............... | H01L 51/5265 |
| 11,404,488 B2* | 8/2022 | Zou | ............... | H01L 27/3248 |
| 11,404,490 B2* | 8/2022 | Li | ............... | H01L 27/322 |
| 11,910,639 B2 | 2/2024 | Na | | |
| 2002/0093284 A1* | 7/2002 | Adachi | ............... | H10K 50/868 |
| | | | | 313/506 |
| 2003/0146695 A1* | 8/2003 | Seki | ............... | H01L 27/3246 |
| | | | | 313/506 |
| 2003/0230972 A1* | 12/2003 | Cok | ............... | H10K 50/86 |
| | | | | 313/504 |
| 2004/0058527 A1* | 3/2004 | Yamazaki | ......... | G02F 1/136286 |
| | | | | 438/643 |
| 2004/0217697 A1* | 11/2004 | Lee | ............... | H10K 50/818 |
| | | | | 313/506 |
| 2005/0008770 A1* | 1/2005 | Kawase | ............ | G02B 5/201 |
| | | | | 427/162 |
| 2005/0017630 A1* | 1/2005 | Ryu | ............... | H10K 59/35 |
| | | | | 313/506 |
| 2005/0067953 A1* | 3/2005 | Yamazaki | ............ | H01L 27/3258 |
| | | | | 313/506 |
| 2005/0142976 A1* | 6/2005 | Suzuki | ............... | H01L 27/3211 |
| | | | | 445/24 |
| 2005/0161830 A1* | 7/2005 | Iki | ............... | G02F 1/136227 |
| | | | | 257/774 |
| 2005/0213002 A1* | 9/2005 | Wen | ............... | G02F 1/133555 |
| | | | | 349/114 |
| 2005/0225232 A1* | 10/2005 | Boroson | ............ | H01L 27/3206 |
| | | | | 313/504 |
| 2005/0253171 A1* | 11/2005 | Kang | ............... | H01L 27/3258 |
| | | | | 257/211 |
| 2005/0269947 A1* | 12/2005 | Kobayashi | ............ | H10K 50/852 |
| | | | | 313/504 |
| 2006/0108917 A1* | 5/2006 | Chung | ............... | H01L 51/5218 |
| | | | | 313/504 |
| 2006/0145159 A1* | 7/2006 | Yokoyama | ............ | H10K 50/818 |
| | | | | 257/E33.064 |
| 2006/0244369 A1* | 11/2006 | Eiichi | ............... | H01L 27/3246 |
| | | | | 313/504 |
| 2006/0250074 A1* | 11/2006 | Lee | ............... | H01L 27/3211 |
| | | | | 313/506 |
| 2007/0102737 A1 | 5/2007 | Kashiwabara et al. | | |
| 2007/0132368 A1* | 6/2007 | Kuwahara | ............ | H01L 51/0021 |
| | | | | 313/506 |
| 2007/0164275 A1* | 7/2007 | Ishiguro | ............... | H01L 27/3258 |
| | | | | 257/40 |
| 2007/0205420 A1* | 9/2007 | Ponjee | ............... | H01L 27/3269 |
| | | | | 257/E27.12 |
| 2008/0169757 A1* | 7/2008 | Chang | ............... | H01L 27/3211 |
| | | | | 313/504 |
| 2008/0284326 A1* | 11/2008 | Choi | ............... | H01L 27/3248 |
| | | | | 313/504 |
| 2009/0051283 A1* | 2/2009 | Cok | ............... | H01L 27/3213 |
| | | | | 313/506 |
| 2009/0159906 A1* | 6/2009 | Ishiguro | ............... | H01L 27/3258 |
| | | | | 257/E33.072 |
| 2009/0160322 A1* | 6/2009 | Yoshida | ............... | H01L 27/3246 |
| | | | | 313/504 |
| 2009/0170230 A1* | 7/2009 | Kidu | ............... | H01L 51/0005 |
| | | | | 118/314 |
| 2009/0184636 A1* | 7/2009 | Cok | ............... | H01L 51/5234 |
| | | | | 313/505 |
| 2009/0200544 A1* | 8/2009 | Lee | ............... | H01L 51/5215 |
| | | | | 438/35 |
| 2009/0251051 A1* | 10/2009 | Hwang | ............... | H01L 27/3213 |
| | | | | 313/504 |
| 2009/0256477 A1* | 10/2009 | Chung | ............... | H01L 51/5209 |
| | | | | 313/505 |
| 2009/0278450 A1* | 11/2009 | Sonoyama | ............ | H01L 27/322 |
| | | | | 313/504 |
| 2009/0283786 A1* | 11/2009 | Kobayashi | ............ | H01L 51/5265 |
| | | | | 257/E33.068 |
| 2009/0295282 A1* | 12/2009 | Yoon | ............... | H01L 51/5215 |
| | | | | 313/504 |
| 2010/0026178 A1* | 2/2010 | Hwang | ............... | H01L 51/5265 |
| | | | | 313/506 |

(56) References Cited

U.S. PATENT DOCUMENTS

| | | | |
|---|---|---|---|
| 2010/0052524 A1* | 3/2010 | Kinoshita | H01L 27/3213 313/504 |
| 2010/0053044 A1* | 3/2010 | Lee | H01L 51/5259 345/80 |
| 2010/0200875 A1* | 8/2010 | Takei | H01L 27/3246 257/E33.064 |
| 2011/0095675 A1* | 4/2011 | Oda | H01L 51/5265 313/499 |
| 2011/0114957 A1* | 5/2011 | Kim | H01L 27/3272 257/E29.292 |
| 2011/0127500 A1* | 6/2011 | Ko | H01L 51/5253 438/35 |
| 2011/0241000 A1* | 10/2011 | Choi | H10K 50/818 257/59 |
| 2011/0241038 A1 | 10/2011 | Kashiwabara et al. | |
| 2011/0316007 A1* | 12/2011 | Sagawa | H01L 27/3258 257/E33.062 |
| 2011/0317429 A1 | 12/2011 | Aiba et al. | |
| 2012/0001185 A1* | 1/2012 | Lee | H01L 27/3246 257/E33.012 |
| 2012/0012834 A1* | 1/2012 | Sonoda | H01L 27/3211 257/40 |
| 2012/0091482 A1* | 4/2012 | Uchida | C23C 14/048 438/22 |
| 2012/0098412 A1* | 4/2012 | Shin | H10K 50/852 445/24 |
| 2012/0098414 A1* | 4/2012 | Nakamura | H01L 27/3246 445/24 |
| 2012/0112172 A1* | 5/2012 | Kashiwabara | H01L 51/5265 438/35 |
| 2012/0228603 A1* | 9/2012 | Nakamura | H01L 51/5234 257/40 |
| 2012/0248465 A1* | 10/2012 | Choi | H10K 50/818 257/E51.019 |
| 2012/0286305 A1* | 11/2012 | Sasaki | H01L 51/5218 257/89 |
| 2012/0299002 A1* | 11/2012 | Kinoshita | H01L 27/3213 257/59 |
| 2013/0119388 A1* | 5/2013 | Lee | H10K 59/124 438/34 |
| 2014/0028181 A1* | 1/2014 | Lee | H01L 27/3211 313/504 |
| 2014/0070671 A1* | 3/2014 | Park | H01L 41/29 29/25.35 |
| 2014/0084310 A1* | 3/2014 | Miura | H01L 51/5253 438/29 |
| 2014/0110735 A1* | 4/2014 | Sato | H01L 27/3262 257/98 |
| 2014/0131679 A1 | 5/2014 | Lee et al. | |
| 2014/0183460 A1* | 7/2014 | Kim | H01L 51/5265 257/40 |
| 2014/0191202 A1* | 7/2014 | Shim | H01L 27/3213 257/40 |
| 2014/0284575 A1* | 9/2014 | Sugisawa | H01L 27/3246 257/40 |
| 2014/0284576 A1* | 9/2014 | Sugisawa | H01L 27/3246 257/40 |
| 2015/0144908 A1* | 5/2015 | Yoon | H01L 27/3216 257/40 |
| 2015/0187852 A1* | 7/2015 | Isa | H01L 27/322 257/43 |
| 2015/0263304 A1* | 9/2015 | Kim | H01L 51/5064 257/40 |
| 2015/0270510 A1* | 9/2015 | Shin | H10K 50/852 438/23 |
| 2015/0280170 A1* | 10/2015 | Harikrishna Mohan | H10K 50/81 257/40 |
| 2015/0318339 A1* | 11/2015 | Nakamura | H01L 51/524 257/98 |
| 2015/0333110 A1* | 11/2015 | Park | H01L 27/3244 438/23 |
| 2016/0126294 A1* | 5/2016 | Nozawa | H01L 27/3248 257/40 |
| 2016/0133878 A1* | 5/2016 | Uesaka | H01L 51/5218 257/40 |
| 2016/0190523 A1* | 6/2016 | Kim | H01L 51/5253 438/23 |
| 2016/0315131 A1* | 10/2016 | Li | H10K 59/124 |
| 2016/0365390 A1* | 12/2016 | Hsu | H01L 27/124 |
| 2016/0372528 A1* | 12/2016 | Kamura | H01L 51/5284 |
| 2017/0077448 A1* | 3/2017 | Sakamoto | H01L 51/5253 |
| 2017/0092707 A1* | 3/2017 | Wang | H10K 59/123 |
| 2017/0098793 A1* | 4/2017 | Isomura | H10K 50/856 |
| 2017/0141172 A1* | 5/2017 | Cho | H01L 51/56 |
| 2017/0194385 A1* | 7/2017 | Jung | H01L 51/5088 |
| 2017/0207249 A1* | 7/2017 | Rhee | G09G 3/3233 |
| 2017/0235173 A1* | 8/2017 | Katoh | H01L 29/786 349/46 |
| 2017/0243928 A1* | 8/2017 | Yang | H10K 50/818 |
| 2017/0250233 A1* | 8/2017 | Ushikubo | H10K 59/351 |
| 2017/0279084 A1* | 9/2017 | Sakamoto | H10K 59/131 |
| 2017/0331062 A1* | 11/2017 | Tamaki | H01L 51/428 |
| 2017/0352842 A1 | 12/2017 | Shiratori et al. | |
| 2018/0061905 A1* | 3/2018 | Choi | H10K 59/122 |
| 2018/0062116 A1* | 3/2018 | Park | H01L 51/5209 |
| 2018/0138259 A1* | 5/2018 | Kim | H01L 27/3258 |
| 2018/0190740 A1* | 7/2018 | Bang | H01L 51/5234 |
| 2018/0190944 A1* | 7/2018 | Lee | H01L 27/3246 |
| 2018/0233694 A1* | 8/2018 | Ajiki | H01L 27/3246 |
| 2018/0240854 A1* | 8/2018 | Nozawa | H01L 27/3206 |
| 2018/0254303 A1* | 9/2018 | Mishima | H01L 51/5265 |
| 2018/0301519 A1* | 10/2018 | Ma | H10K 59/35 |
| 2019/0006617 A1* | 1/2019 | Miura | H01L 27/3246 |
| 2019/0058022 A1* | 2/2019 | Baik | H01L 51/5278 |
| 2019/0131352 A1* | 5/2019 | Choi | H01L 27/3213 |
| 2019/0163531 A1 | 5/2019 | Lai et al. | |
| 2019/0165085 A1* | 5/2019 | Choi | H01L 51/5228 |
| 2019/0165317 A1* | 5/2019 | Lai | H01L 27/3258 |
| 2019/0172874 A1* | 6/2019 | Lim | H01L 51/5206 |
| 2019/0172898 A1* | 6/2019 | Choi | H01L 51/56 |
| 2019/0181199 A1* | 6/2019 | Choi | H10K 59/124 |
| 2019/0181200 A1* | 6/2019 | Jung | H01L 51/5203 |
| 2019/0189701 A1* | 6/2019 | Bang | H01L 51/5271 |
| 2019/0189713 A1* | 6/2019 | Kondo | H10K 71/00 |
| 2019/0198816 A1* | 6/2019 | Park | G02B 27/0176 |
| 2019/0206949 A1* | 7/2019 | Park | H10K 59/131 |
| 2019/0206953 A1* | 7/2019 | Hsieh | H10K 50/826 |
| 2019/0207163 A1* | 7/2019 | Paek | H01L 51/5209 |
| 2019/0229163 A1* | 7/2019 | Murai | H01L 27/326 |
| 2019/0256655 A1* | 8/2019 | Masuda | H01L 23/12 |
| 2019/0326359 A1* | 10/2019 | Yang | H10K 59/122 |
| 2019/0363290 A1* | 11/2019 | Watanabe | H05B 33/04 |
| 2020/0013839 A1* | 1/2020 | Tanaka | H01L 51/56 |
| 2020/0028107 A1* | 1/2020 | Sakaguchi | H05B 33/04 |
| 2020/0035758 A1* | 1/2020 | Kang | G02B 3/0075 |
| 2020/0119106 A1* | 4/2020 | Kim | H01L 27/3218 |
| 2020/0127056 A1* | 4/2020 | Guo | H01L 27/3211 |
| 2020/0136078 A1* | 4/2020 | Mishima | H01L 51/5076 |
| 2020/0152711 A1* | 5/2020 | Liu | H01L 51/5218 |
| 2020/0185471 A1* | 6/2020 | Lee | H01L 27/3246 |
| 2020/0185650 A1* | 6/2020 | Lim | H01L 51/5265 |
| 2020/0194518 A1* | 6/2020 | Myung | H01L 27/3225 |
| 2020/0194522 A1* | 6/2020 | Lee | H01L 51/56 |
| 2020/0194713 A1* | 6/2020 | Kim | H01L 51/5209 |
| 2020/0203448 A1* | 6/2020 | Kim | H01L 51/5209 |
| 2020/0212121 A1* | 7/2020 | Kang | H01L 27/3211 |
| 2020/0358019 A1 | 11/2020 | Tsai et al. | |
| 2020/0381652 A1* | 12/2020 | Zhang | H01L 27/3206 |
| 2021/0028243 A1* | 1/2021 | Yang | H10K 71/00 |
| 2021/0043705 A1* | 2/2021 | Lim | H01L 27/3258 |
| 2021/0050387 A1* | 2/2021 | Kim | H01L 27/3206 |
| 2021/0057670 A1* | 2/2021 | Wong | H10K 50/818 |
| 2021/0066416 A1* | 3/2021 | Yang | H01L 51/5265 |
| 2021/0074953 A1* | 3/2021 | Kim | H01L 51/5271 |
| 2021/0091152 A1* | 3/2021 | Yang | H01L 51/5218 |
| 2021/0091334 A1* | 3/2021 | Heo | H01L 51/5206 |
| 2021/0098748 A1* | 4/2021 | Liu | H01L 27/3211 |
| 2021/0111235 A1* | 4/2021 | Ichikawa | H05B 33/22 |
| 2021/0111312 A1* | 4/2021 | Chang | H01L 27/3248 |
| 2021/0111366 A1* | 4/2021 | Chang | H01L 51/5265 |

(56) References Cited

U.S. PATENT DOCUMENTS

| | | | | |
|---|---|---|---|---|
| 2021/0116810 | A1* | 4/2021 | Hashimoto | G09F 9/30 |
| 2021/0119175 | A1* | 4/2021 | Harikrishna Mohan | H01L 51/5225 |
| 2021/0134895 | A1* | 5/2021 | Wang | H01L 27/3218 |
| 2021/0159457 | A1* | 5/2021 | Cho | H10K 50/8445 |
| 2021/0167319 | A1* | 6/2021 | Quan | H01L 51/5265 |
| 2021/0202886 | A1* | 7/2021 | Kim | H01L 27/3258 |
| 2021/0217819 | A1* | 7/2021 | Lius | H01L 27/3272 |
| 2021/0233969 | A1* | 7/2021 | Sun | H10K 59/122 |
| 2021/0265417 | A1* | 8/2021 | Lin | H01L 27/156 |
| 2021/0280822 | A1* | 9/2021 | Wang | H01L 51/5253 |
| 2021/0328174 | A1* | 10/2021 | Chang | H01L 27/3248 |
| 2021/0335901 | A1* | 10/2021 | Hu | H01L 51/5265 |
| 2021/0335942 | A1* | 10/2021 | Wang | H01L 27/3253 |
| 2021/0366994 | A1* | 11/2021 | Li | H01L 51/56 |
| 2021/0367003 | A1* | 11/2021 | Zhou | H01L 27/3265 |
| 2021/0367005 | A1* | 11/2021 | Zou | H10K 50/84 |
| 2021/0375999 | A1* | 12/2021 | Xu | H10K 50/844 |
| 2021/0376282 | A1* | 12/2021 | Chang | H01L 51/5218 |
| 2021/0384265 | A1* | 12/2021 | Hou | H10K 59/30 |
| 2022/0036773 | A1* | 2/2022 | Wu | H01L 51/0097 |
| 2022/0037432 | A1* | 2/2022 | Xu | H10K 50/856 |
| 2022/0077250 | A1* | 3/2022 | Tang | H01L 27/3246 |
| 2022/0140018 | A1* | 5/2022 | Liu | H10K 50/818 257/40 |
| 2022/0140047 | A1* | 5/2022 | Zhu | H01L 27/3276 257/40 |
| 2022/0320208 | A1* | 10/2022 | Seo | H01L 27/3216 |
| 2022/0328790 | A1* | 10/2022 | Seon | H01L 51/0096 |
| 2022/0359609 | A1* | 11/2022 | Lin | H01L 27/156 |
| 2022/0359846 | A1* | 11/2022 | Chang | H01L 27/3244 |
| 2022/0367575 | A1* | 11/2022 | Ikeda | H01L 51/5253 |
| 2022/0376013 | A1* | 11/2022 | Li | H10K 50/856 |

OTHER PUBLICATIONS

Southwest Center for Microsystems Education (SCME) University of New Mexico. "The Rainbow Wafer Activity." Published in 2010.
Physics and Radio-Electronics. "Light Emitting Diode (LED)." The date of publication is unknown. Retrieved online on Aug. 2, 2019 from https://www.physics-and-radio-electronics.com/electronic-devices-and-circuits/semiconductor-diodes/lightemit-tingdiodeledconstructionworking.html.
Kmide et al. "Light Scattering." Graphene, 2014, published in 2014.
Microwaves101.com "Photolithography 101." Published Dec. 2011.
Mirshafieyan et al. "Silicon colors: spectral selective perfect light absorption in single layer silicon films on aluminum surface and its thermal tunability." Optics Express 22(25):31545-31554, published on Dec. 12, 2014.
Bohlen, Brandon Scott. "PECVD grown DBR for microcavity OLED sensor." Retrospective Theses and Dissertations. 14847, published in 2007.
Phuong Le Minh. "Silicon Light Emitting Devices for Integrated Applications." University of Twente, published in 2003.
Addison Engineering, Inc. "Silicon Nitride—LPCVD Grown." The date of publication is unknown. Retrieved online on Aug. 8, 2019 from https://www.addisonengineering.com/.
Wikipedia.org. "OLED." Published on Jul. 23, 2019.
Wikipedia.org "Pixel." Published on Jul. 27, 2019.
Wikipedia.org "Sputter Cleaning." Published on Nov. 6, 2017.
Wikipedia.org "Sputtering." Published on May 4, 2019.
Wikipedia.org "Transparent Conducting Film." Published on Jul. 13, 2019.
Non-Final Office Action dated Mar. 25, 2024, for U.S. Appl. No. 17/872,585.

* cited by examiner

METHOD FOR FORMING AN ISOLATION STRUCTURE HAVING MULTIPLE THICKNESSES TO MITIGATE DAMAGE TO A DISPLAY DEVICE

BACKGROUND

Many modern day electronic devices, such as televisions and cellular devices, use image display devices to convert digital data into optical images. To achieve this, the image display device may comprise an array of pixel regions. Each pixel region may have an optical emitter structure and may be coupled to a semiconductor device. The semiconductor device may selectively apply an electrical signal (e.g., a voltage) to the optical emitter structure. Upon application of the electrical signal, the optical emitter structure may emit an optical signal (e.g., light). The optical emitter structure may, for example, be an organic light emitting diode (OLED) or some other suitable light emitting device.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
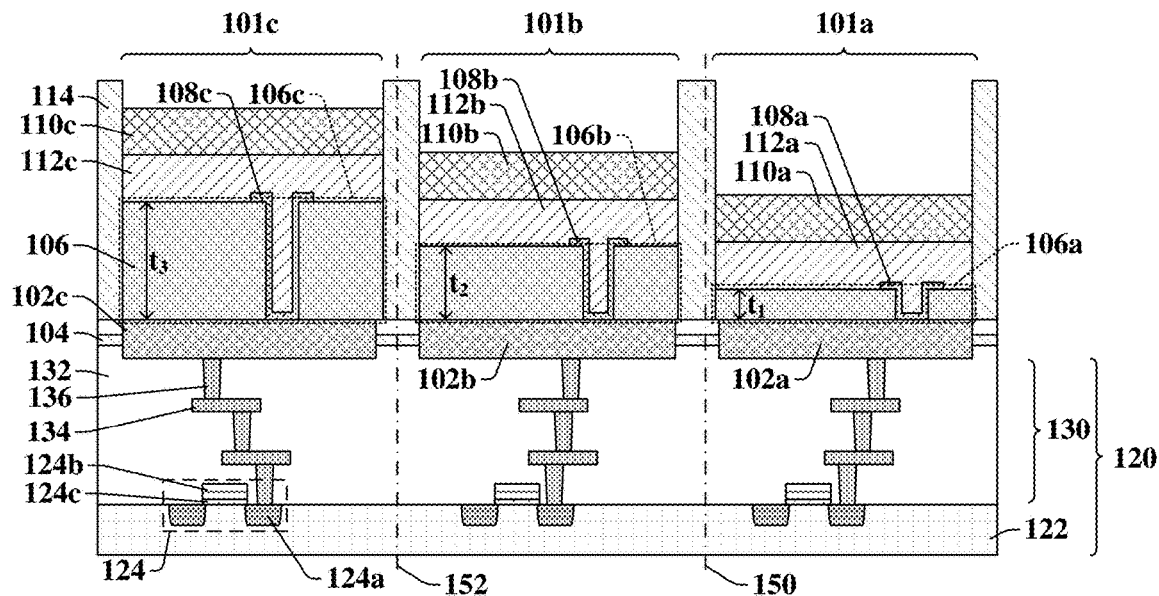
FIG. 1 illustrates a cross-sectional view of some embodiments of a display device having an isolation structure arranged over a reflector electrode structure, where the isolation structure comprises a first portion and further comprises a second portion that is spaced apart from and has a different thickness than the first portion.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A display device includes an array of pixel regions, wherein each pixel region comprises a portion of an isolation structure arranged between a reflector electrode and a transparent electrode. A via structure may extend through the isolation structure to electrically couple the reflector electrode to the transparent electrode. An optical emitter structure may be arranged over the transparent electrode. The isolation structure may comprise silicon dioxide and the portion of the isolation structure may have a thickness that corresponds to a certain color. For example, during operation of the display device, an electrical signal (e.g., voltage) may be applied to the transparent electrode from circuitry coupled to the reflector electrode, the via structure, and the transparent electrode. The electrical signal may cause light to be produced at the interface between the optical emitter structure and the transparent electrode (e.g., due to electron-hole recombination). The light may reflect off a top surface of the isolation structure and/or may travel through the isolation structure, reflect off of the reflector electrode, and travel back towards the top surface of the isolation structure. Due to constructive interference of a given wavelength of light at the top surface of the isolation structure, and/or destructive interface of other wavelengths of light at the top surface of the isolation, colored light according to the thickness of the portion of the isolation structure may be emitted from a top surface of the optical emitter structure.

To form the isolation structure, a first isolation layer may, for example, be formed over a first reflector electrode and a second reflector electrode. The first isolation layer may then be patterned to remove the first isolation layer from the second reflector electrode. A second isolation layer may then be formed over the first isolation layer and the second reflector electrode. However, the patterning of the first isolation layer may damage (e.g., pits, crystal defects, increased surface roughness, etc.) a top surface of the second reflector electrode, and thus, impact the interface between the second isolation layer and the second reflector electrode. For example, an etching process may be used to remove the first isolation layer that covers the second reflector electrode. The etching process may use a dry etchant and damage the top surface of the second reflector electrode by increasing the surface roughness. Because the second reflector electrode receives and reflects light at the top surface of the second reflector, when the top surface is damaged, the reflected light may scatter, which may cause the emitted light to be a different color and/or reduce the intensity of the emitted light, for example. Thus, the aforementioned patterning process may result in an unreliable display device.

Various embodiments of the present disclosure are directed towards a method of forming an isolation structure comprising a first portion, a second portion, and a third portion that are separated from one another to mitigate damage to the underlying reflector electrode structure of a display device. In some embodiments, a first reflector electrode and a second reflector electrode are formed over an interconnect structure. A first isolation layer is deposited over the first and second reflector electrodes. A first masking layer is formed over the first reflector electrode such that the first masking layer directly overlies the first reflector electrode and does not directly overlie the second reflector electrode. A second isolation layer is deposited over the first isolation layer and over the first masking layer. A second masking layer is then formed over the second reflector electrode such that the second masking layer directly overlies the second reflector electrode and does not directly overlie the first reflector electrode or the first masking layer.

A first removal process is performed to remove portions of the first and second isolation layers that do not directly underlie the first or second masking layers. The first and second masking layers are hard masks, and thus, during the first removal process, the first and second masking layers protect the underlying first isolation layer, second isolation layer, first reflector electrode, and second reflector electrode from damage caused by the first removal process. For example, in some embodiments, the first removal process utilizes plasma dry etching, and the first and second masking layers block ions from passing through to underlying first and second isolation layers and underlying first and second reflector electrodes. Further, a second removal process is performed to remove the first and second masking layers. The second removal process may be performed by a wet etch to selectively remove the first and second masking layers, while the first and second reflector electrodes are protected by the first and second isolation layers. Thus, because the first and second reflector electrodes are respectively protected during the first and second removal processes to form the isolation structure, damage to the first and second reflector electrodes is mitigated to produce a reliable device.

FIG. 1 illustrates a cross-sectional view 100 of some embodiments of a display device comprising an isolation structure having first, second, and third portions separated from one another.

The display device of the cross-sectional view 100 includes a first pixel region 101*a*, a second pixel region 101*b*, and a third pixel region 101*c*. Each of the first, second, and third pixel regions 101*a*, 101*b*, 101*c* are configured to emit a different color of light (e.g., red, green, blue) when subjected to an electrical signal (e.g., voltage), and the color of light depends on the thickness and material of an isolation structure 106. For example, in some embodiments, the first pixel region 101*a* may comprise a first portion 106*a* of the isolation structure 106 that has a first thickness t1; the second pixel region 101*b* may comprise a second portion 106*b* of the isolation structure 106 that has a second thickness $t_2$; and the third pixel region 101*c* may comprise a third portion 106*c* of the isolation structure 106 that has a third thickness $t_3$. In some embodiments, the first, second, and third thicknesses $t_1$, $t_2$, $t_3$ are each different from one another. For example, in some embodiments, the first thickness $t_1$ may be less than the second and third thicknesses $t_2$, $t_3$, and the second thickness $t_2$ may be less than the third thickness $t_3$.

In some embodiments, the first portion 106*a*, the second portion 106*b*, and the third portion 106*c* of the isolation structure 106 may each comprise one or more oxides, such as, for example, silicon dioxide, aluminum oxide, or the like. In other embodiments, the first portion 106*a*, the second portion 106*b*, and the third portion 106*c* of the isolation structure 106 may comprise a nitride (e.g., silicon nitride), or some other material that has optical properties, such that colored light is visible from the surface of the material and the colored light is dependent on the thickness of each portion (106*a*, 106*b*, 106*c*) of the isolation structure 106. For example, the first thickness $t_1$ may correspond to red light; the second thickness $t_2$ may correspond to blue light; and the third thickness $t_3$ may correspond to green light.

The first portion 106*a* of the isolation structure 106 may be arranged between a first reflector electrode 102*a* and a first transparent electrode 112*a*. The second portion 106*b* of the isolation structure 106 may be arranged between a second reflector electrode 102*b* and a second transparent electrode 112*b*. The third portion 106*c* of the isolation structure 106 may be arranged between a third reflector electrode 102*c* and a third transparent electrode 112*c*. A first optical emitter structure 110*a*, a second optical emitter structure 110*b*, and a third optical emitter structure 110*c* may be arranged over the first transparent electrode 112*a*, the second transparent electrode 112*b*, and the third transparent electrode 112*c*, respectively. In some embodiments, a first via structure 108*a*, a second via structure 108*b*, and a third via structure 108 extend through the first portion 106*a* of the isolation structure 106, the second portion 106*b* of the isolation structure 106, and the third portion 106*c* of the isolation structure 106, respectively. The via structures (108*a*, 108*b*, 108*c*) extend from a top surface to a bottom surface of the portions (106*a*, 106*b*, 106*c*) of the isolation structure 106. Thus, the first via structure 108*a* may electrically couple the first reflector electrode 102*a* to the first transparent electrode 112*a*; the second via structure 108*b* may electrically couple the second reflector electrode 102*b* to the second transparent electrode 112*b*; and the third via structure 108*c* may electrically couple the third reflector electrode 102*c* to the third transparent electrode 112*c*.

In some embodiments, the first, second, and third reflector electrodes 102*a*, 102*b*, 102*c* may be coupled to control circuitry 120. For example, in some embodiments, the first, second, and third reflector electrodes 102*a*, 102*b*, 102*c* are disposed over an interconnect structure 130 comprising a network of interconnect wires 134 and interconnect vias 136 embedded in an interconnect dielectric structure 132. In some embodiments, the interconnect structure 130 is arranged over a substrate 122 and coupled to semiconductor devices 124. In some embodiments, the semiconductor devices 124 may be, for example, metal oxide semiconductor field-effect transistors (MOSFETs) comprising source/drain regions 124*a* within the substrate 122 and a gate electrode 124*b* over the substrate 122. The gate electrode 124*b* may be separated from the substrate 122 by a gate dielectric layer 124*c*. The control circuitry 120 is configured to selectively supply an electrical signal (e.g., voltage) to each of the first, second, and third pixel regions 101*a*, 101*b*, 101*c* to emit colored light as indicated by digital data. For example, if the electrical signal (e.g., voltage) is supplied to the first reflector electrode 102*a* from the control circuitry 120, the electrical signal (e.g., voltage) may cause the first optical emitter structure 110*a* to produce light, and that light may reflect off of top surfaces of the first portion 106*a* of the isolation structure 106 and/or travel through the first portion 106*a* of the isolation structure 106, reflect off of the first reflector electrode 102*a* and exit through the top surfaces of the first portion 106*a* of the isolation structure 106. Due to constructive and/or destructive interference, colored light dependent on the first thickness $t_1$ and material of the first portion 106*a* of the isolation structure 106 is visible.

In some embodiments, first barrier structures 104 and/or second barrier structures 114 separate the first, second, and third pixel regions 101a-101c. In some embodiments, each of the first, second, and third portions 106a, 106b, 106c of the isolation structure 106 are completely separated from one another by the second barrier structures 114.

For example, in some embodiments, a first line 150 may be arranged between the first and second portions 106a, 106b of the isolation structure 106 without intersecting the first or second portions 106a, 106b of the isolation structure 106. The first line 150 may continuously extend in a first direction that is normal to an upper surface of the first reflector electrode 102a, and also may be arranged between the first reflector electrode 102a and the second reflector electrode 102b, between the first transparent electrode 112a and the second transparent electrode 112b, and between the first optical emitter structure 110a and the second optical emitter structure 110b. In some embodiments, the first line 150 may intersect the first and second barrier structures 104, 114. Thus, in some embodiments, the second barrier structures 114 directly overlie the first barrier structures 104. Further, a second line 152 that is parallel to the first line 150 and continuously extends in the first direction may be arranged between the second portion 106b of the isolation structure 106 and the third portion 106b of the isolation structure 106 without intersecting the second or third portions 106b, 106c of the isolation structure 106. In some embodiments, each of the first, second, and third portions 106a, 106b, 106c of the isolation structure 106 may be completely separated from one another as a result of protecting the first, second, and third reflector electrodes 102a, 102b, 102c during manufacturing of the isolation structure 106; in some embodiments, the separation amongst the first, second, and third portions 106a, 106b, 106c of the isolation structure 106 also mitigates optical interference between each of the first, second, and third pixel regions 101a, 101b, 101c to provide a reliable display device.

Figure 2:
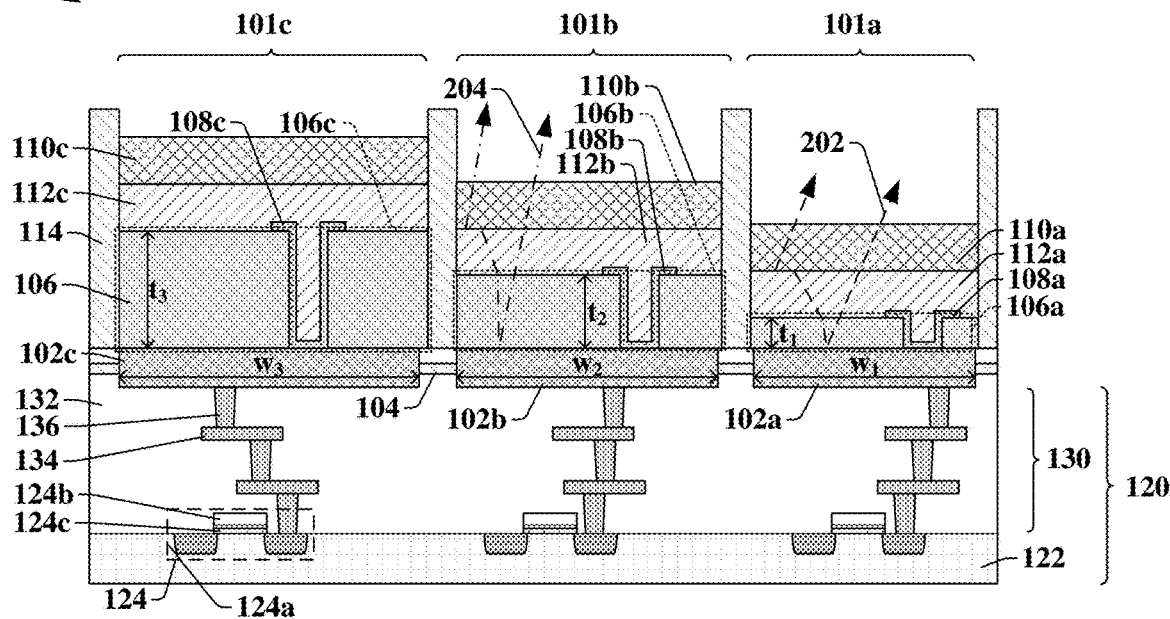
FIG. 2 illustrates a cross-sectional view of some additional embodiments of a display device as in FIG. 1, as well as an example light path through a portion of the isolation structure.

FIG. 2 illustrates a cross-sectional view 200 of some embodiments of a display device comprising an isolation structure having first, second, and third portions separated from one another and an example light path during operation of the display device.

The display device in the cross-sectional view 200 includes a first reflector electrode 102a having a first width $w_1$, a second reflector electrode 102b having a second width $w_2$, and a third reflector electrode 102c having a third width $w_3$. In some embodiments, the first width $w_1$, the second width $w_2$, and the third width $w_3$ may be substantially equal to one another, as in FIG. 1, for example, whereas in other embodiments, as in FIG. 2, the first, second, and third widths $w_1$, $w_2$, $w_3$ may be different from one another. For example, in some embodiments, the third width $w_3$ may be smaller than the second width $w_2$, and the second width $w_2$ may be smaller than the first width $w_1$. In some embodiments, the smallest width (e.g., $w_1$) corresponds to the pixel region (e.g., 101a) that has the portion (e.g., 106a) of the isolation structure 106 with the smallest thickness (e.g., $t_1$). Similarly, in some embodiments, the largest width (e.g., $w_3$) corresponds to the pixel region (e.g., 101a) that has the portion (e.g., 106c) of the isolation structure (e.g., 106) with the largest thickness (e.g., $t_3$). However, in other embodiments, the widths (e.g., $w_1$, $w_2$, $w_3$) of the reflector electrodes (e.g., 102a, 102b, 102c) in each pixel region (e.g., 101a, 101b, 101c) do not have a correlation with the thicknesses (e.g., $t_1$, $t_2$, $t_3$) of the portions (e.g., 106a, 106b, 106c) of the isolation structure (e.g., 106).

The cross-sectional view 200 also illustrates an exemplary first light path 202 in the first pixel region 101a and an exemplary second light path 204 in the second pixel region 101b. In some embodiments, light is generated by the first optical emitter structure 110a and the second optical emitter structure 110b due to an electrical signal (e.g., voltage) applied to the first reflector electrode 102a and the second electrode 102b, respectively, by the control circuitry 120. For example, in the cross-sectional view 200, the first pixel region 101a and the second pixel region 101b are "ON" (e.g., light is generated at the first and second optical emitter structures 110a, 110b), whereas the third pixel region 101c is "OFF" (e.g., light is not generated by the third optical emitter structure 110c). In the first pixel region 101a, the exemplary first light path 202 shows how in some embodiments, the generated light at the first optical emitter structure 110a may reflect off of a top surface of the first portion 106a of the isolation structure 106 and/or travel through the first portion 106a of the isolation structure 106, reflect off of the first reflector electrode 102a, and travel back up towards the top surface of the first portion 106a of the isolation structure 106. Due to constructive interference of a first wavelength and/or destructive interference of remaining wavelengths, colored light having the first wavelength that is emitted/ visible from a top surface of the first optical emitter structure 110a in the first pixel region 101a. The first wavelength is associated with the first thickness $t_1$ and material(s) of the first portion 106a of the isolation structure 106 and, in some embodiments, is the only wavelength or the predominant wavelength emitted/visible from the top surface of the first optical emitter structure 110a.

Similarly, in the second pixel region 101b, the exemplary second light path 204 shows how in some embodiments, the generated light at the second optical emitter structure 110b may reflect off of a top surface of the second portion 106b of the isolation structure 106 and/or travel through the second portion 106b of the isolation structure 106, reflect off of the second reflector electrode 102b, and travel back up towards the top surface of the second portion 106b of the isolation structure 106. Due to constructive of a second wavelength and/or destructive interference of remaining wavelengths, colored light having the second wavelength is emitted/visible from a top surface of the second optical emitter structure 110b in the second pixel region 101b. The second wavelength is associated with the second thickness $t_2$ and material(s) of the second portion 106b of the isolation structure 106 and, in some embodiments, is the only wavelength or the predominant wavelength emitted/visible from the top surface of the second optical emitter structure 110b. In some embodiments, because the second thickness $t_2$ of the second portion 106b of the isolation structure 106 is different than the first thickness $t_1$ of the first portion 106a of the isolation structure 106, the second wavelength will be different from the first wavelength, and thus, the second pixel region 101b emits a different colored light than the first pixel region 101a. Thus, the control circuitry 120 may use digital data to selectively turn "ON" one or more of the pixel regions (e.g., 101a, 101b, 101c) to produce an optical image.

Figure 3:
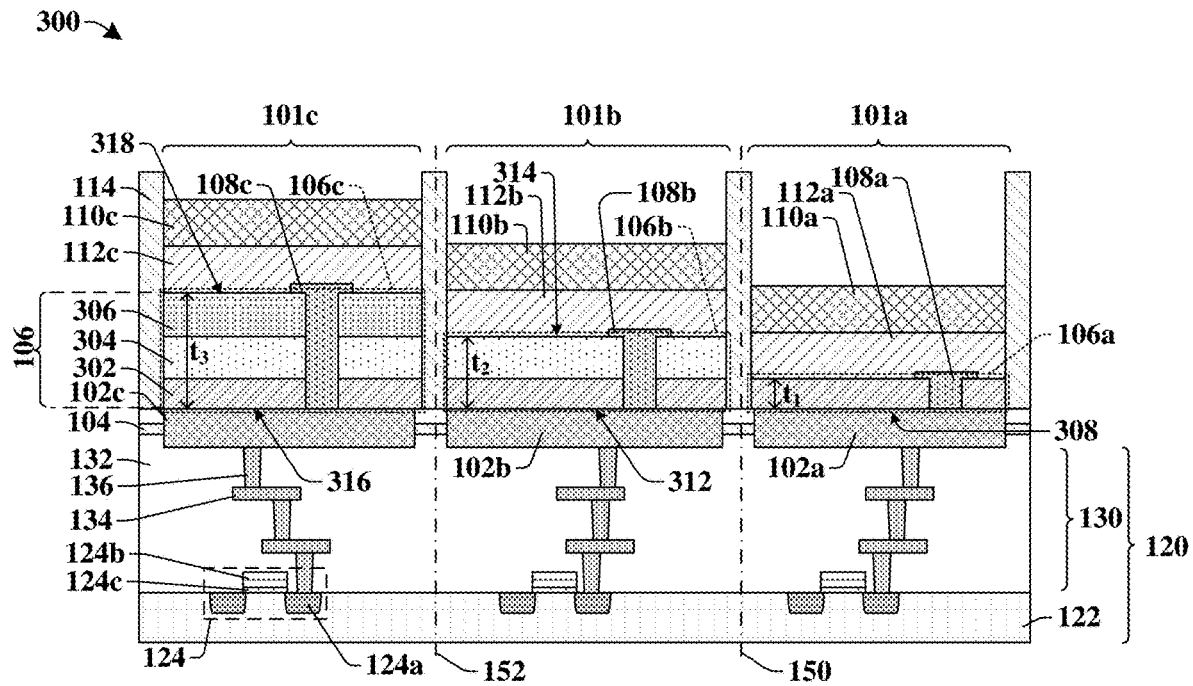
FIGS. 3 and 4 illustrates cross-sectional views of some additional embodiments of a display device as in FIG. 1, wherein the display device comprises an isolation structure having layers of different materials.

FIG. 3 illustrates a cross-sectional view 300 of some embodiments of a display device comprising an isolation structure having first, second, and third portions, wherein the second and third portions comprise multiple layers.

The display device in the cross-sectional view 300 includes: 1) a first portion 106a of an isolation structure 106 comprising a first isolation layer 302; 2) a second portion 106b of the isolation structure 106 comprising a second isolation layer 304 arranged over the first isolation layer 302; and 3) a third portion 106c of the isolation structure 106 comprising the second isolation layer 304 arranged over the first isolation layer 302 and arranged below a third isolation layer 306. The first, second, and third portions 106a, 106b, 106c of the isolation structure 106 are still separated from one another by the second barrier structures 114. In some embodiments, the first, second, and third isolation layers 302, 304, 306 comprise different materials. For example, in some embodiments, the first isolation layer 302 may comprise aluminum oxide; the second isolation layer 304 may comprise silicon dioxide; and the third layer may comprise some other material that has optical properties, such as silicon nitride. In other embodiments, each of the first isolation layer 302, the second isolation layer 304, and the third isolation layer 306 may comprise a same material, such as, for example, silicon dioxide. In such embodiments, the isolation layers (302, 304, 306) may not be distinguishable from one another, and the first, second, and third portions 106a, 106b, 106c of the isolation structure 106 may look like the first, second, and third portions 106a, 106b, 106c of the isolation structure 106 illustrated in the cross-sectional view 100 of FIG. 1.

In some embodiments, the first thickness $t_1$ of the first portion 106a of the isolation structure 106 may equal a thickness of the first isolation layer 302. In some embodiments, the first portion 106a of the isolation structure 106 contacts the first reflector electrode 102a at a first interface 308 and contacts the first transparent electrode 112a at a second interface 310. The first thickness $t_1$ of the first portion 106a of the isolation structure 106 may be measured from the first interface 308 to the second interface 310 in a first direction normal to a top surface of the first reflector electrode 102a. In some embodiments, the second thickness $t_2$ of the second portion 106b of the isolation structure 106 may equal a sum of the thickness of the first isolation layer 302 and a thickness of the second isolation layer 304. In some embodiments, the second portion 106b of the isolation structure 106 contacts the second reflector electrode 102b at a third interface 312 and contacts the second transparent electrode 112b at a fourth interface 314. The second thickness $t_2$ of the second portion 106b of the isolation structure 106 may be measured from the third interface 312 to the fourth interface 314 in the first direction. In some embodiments, the third thickness $t_3$ of the third portion 106c of the isolation structure 106 may equal a sum of the thickness of the first isolation layer 302, the thickness of the second isolation layer 304, and a thickness of a third isolation layer 306. In some embodiments, the third portion 106c of the isolation structure 106 contacts the third reflector electrode 102c at a fifth interface 316 and contacts the third transparent electrode 112c at a sixth interface 318. The third thickness $t_3$ of the third portion 106c of the isolation structure 106 may be measured from the fifth interface 316 to the sixth interface 318 in the first direction.

The cross-sectional view 300 of FIG. 3 further illustrates that in some embodiments, the first, second, and third via structures 108a, 108b, 108c may respectively extend completely through the first, second, and third portions 106a, 106b, 106c of the isolation structure 106. In some embodiments, the via structure (108a,108b,108c) comprises a material that completely fill the space between outer sidewalls of each via structures (108a, 108b, 108c). In other embodiments (e.g., FIG. 1), the transparent electrode (112a, 112b, 112c) fills some of the space between the outer sidewalls of the via structure (108a, 108b, 108c). In such embodiments, the electrical connection between the transparent electrode (112, 112b, 112c) and the reflector electrode (102a, 102b, 102c) may be more efficient because the via structure (108a, 108b, 108c) is thinner between the reflector electrode (102a, 102b, 102c) and the transparent electrode (112a, 112b, 112c).

Figure 4:
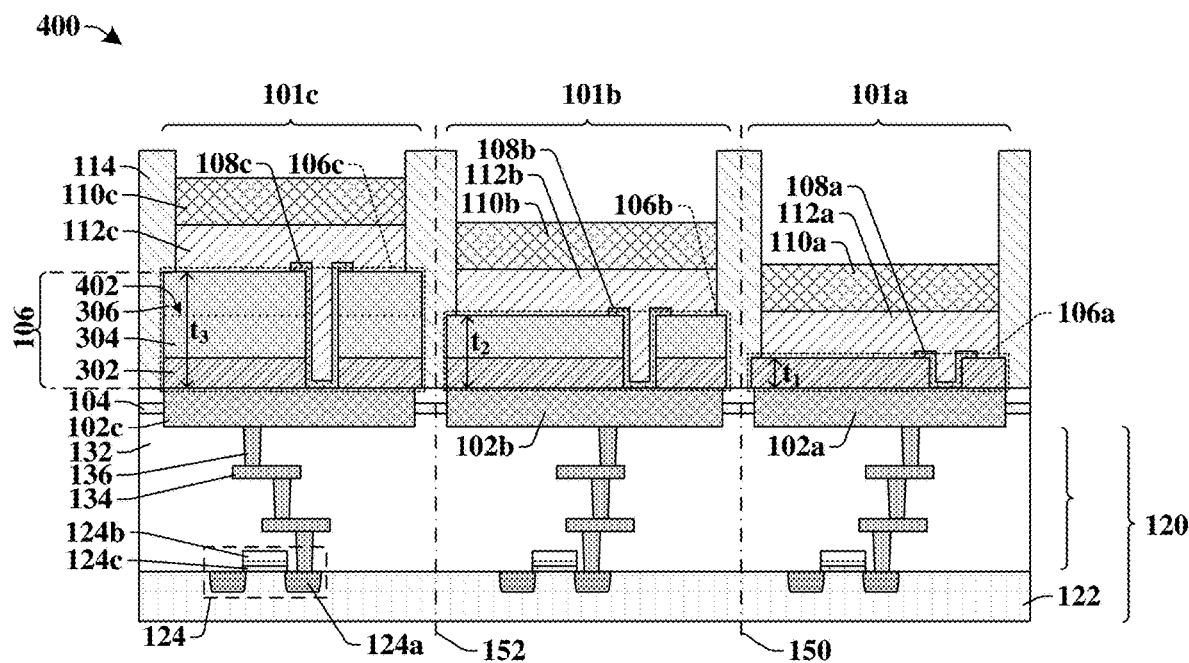

FIG. 4 illustrates a cross-sectional view 400 of an isolation structure having first, second, and third portions, wherein the third portion of the isolation structure comprises second and third layers comprising a same material.

The cross-sectional view 400 of FIG. 4 illustrates some embodiments of a display device wherein the portions (106a, 106b, 106c) of the isolation structure (106) may be wider than their respective overlying transparent electrodes (112a, 112b, 112c) and/or optical emitter structures (110a, 110b, 110c).

Further, the display device in the cross-sectional view 400 includes the first, second, and third portions 106a, 106b, 106c of the isolation structure 106. In some embodiments, the third portion 106c of the isolation structure 106 may comprise the first isolation layer 302, the second isolation layer 304, and the third isolation layer 304. In some embodiments, the first isolation layer 302 may comprise a first material, and the second and third isolation layers 304, 306 may comprise a second material that is different than the first material. For example, in some embodiments, the first material may comprise aluminum oxide, and the second material may comprise silicon dioxide. In some embodiments, the first isolation layer 302 may be thinner than each of second and third isolation layers 304, 306. In such embodiments, the first isolation layer 302 may comprise aluminum oxide, for example, because during deposition, it may be easier to control the thickness of aluminum oxide than silicon dioxide, for example. Because the second and third isolation layers 304, 306 may comprise the same second material, a seventh interface 402 between the second and third isolation layers 304, 306 may not be distinguishable, as illustrated by a dotted line.

FIGS. 5-18, 19A-19C, 20, and 21 illustrate cross-sectional views 500-1800, 1900A-1900C, 2000, and 2100 of some embodiments of a method of forming an isolation structure over a reflector electrode structure to prevent damage to the reflector electrode structure and to produce a reliable display device. Although FIGS. 5-18, 19A-19C, 20, and 21 are described in relation to a method, it will be appreciated that the structures disclosed in FIGS. 5-18, 19A-19C, 20, and 21 are not limited to such a method, but instead may stand alone as structures independent of the method.

Figure 5:
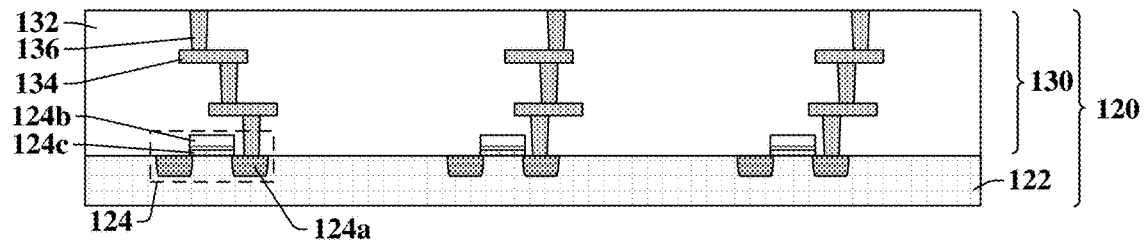
FIGS. 5-18, 19A-19C, 20, and 21 illustrate cross-sectional views of some embodiments of a method of forming a display device having an isolation structure arranged over a reflector electrode structure, wherein the isolation structure comprises first and second portions spaced apart from one another to mitigate damage to the reflector electrode structure.

As shown in the cross-sectional view 500 of FIG. 5, in some embodiments, control circuitry 120 may be formed over a substrate 122. In some embodiments, the control circuitry 120 may comprise an interconnect structure 130 arranged over a substrate 122. The interconnect structure 130 may comprise interconnect wires 134 and interconnect vias 136 embedded in an interconnect dielectric structure 132. In some embodiments, the interconnect wires and vias 134, 136 may comprise copper, tungsten, or the like. The interconnect structure 130 may be coupled to semiconductor devices 124 integrated on the substrate 122. In some embodiments, the semiconductor devices 124 may be or comprise metal oxide semiconductor field-effect transistors (MOSFETs), wherein the MOSFETs comprise source/drain regions 124a in the substrate 122. The semiconductor devices 124 may further comprise a gate electrode 124b arranged over a gate dielectric layer 124c on the substrate 122.

Figure 6:
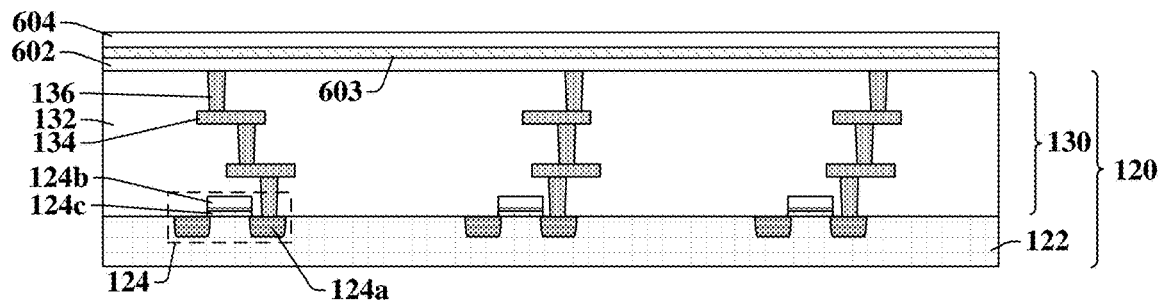

As shown in the cross-sectional view 600 of FIG. 6, a first dielectric layer 602, a first barrier layer 603, and a second dielectric layer 604 may be formed over the interconnect structure 130. In some embodiments, the first dielectric layer 602, the first barrier layer 603, and the second dielectric layer 604 may comprise a same material. In other embodiments, at least the first barrier layer 603 may comprise a different material than the first and/or second dielectric layers 602, 604. The first barrier layer 603 may comprise a dielectric material that may also act as an etch stop layer to protect the interconnect structure 130. For example, in some embodiments, the first barrier layer 603 may comprise a nitride (e.g., silicon nitride), a carbide (e.g., silicon carbide), or the like. Further, in some embodiments, the first and second dielectric layers 604 may comprise a dielectric material such as, for example, nitride (e.g., silicon nitride, silicon oxynitride), a carbide (e.g., silicon carbide), an oxide (e.g., silicon oxide), borosilicate glass (BSG), undoped silicate glass (USG), phosphoric silicate glass (PSG), borophosphosilicate glass (BPSG), a low-k oxide (e.g., a carbon doped oxide, SiCOH), or the like. In some embodiments, the first and/or second dielectric layers 604 may comprise a same material as the interconnect dielectric structure 132. In some embodiments, the first dielectric layer 602, the first barrier layer 603, and/or the second dielectric layer 604 may each be formed using a deposition process (e.g., physical vapor deposition (PVD), chemical vapor deposition (CVD), PE-CVD, atomic layer deposition (ALD), sputtering, etc.).

Figure 7:
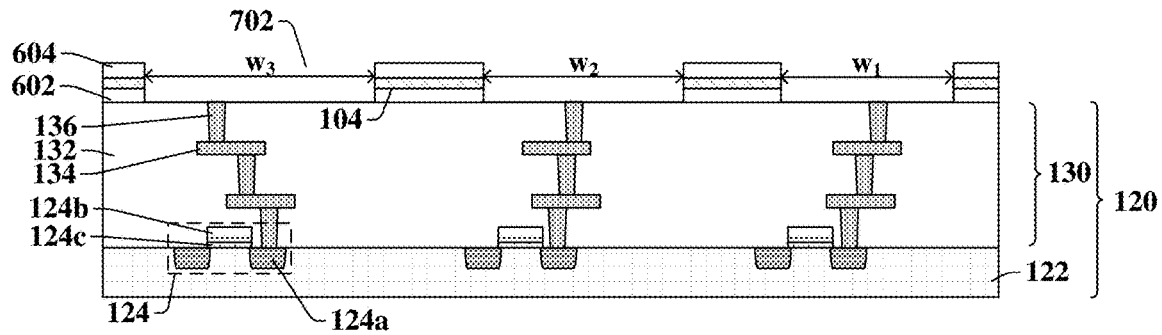

As shown in the cross-sectional view 700 of FIG. 7, portions of the first dielectric layer 602, the second dielectric layer 604, and the first barrier layer (603 of FIG. 6) are removed to define cavities 702 separated by first barrier structures 104. Each cavity 702 may expose a top one of the interconnect vias 136. The cavities 702 may be formed using photolithography and removal (e.g., etching) processes. In some embodiments, each cavity 702 may have equal widths, wherein a first width $w_1$ is equal to a second width $w_2$ and a third width $w_3$. In other embodiments, at least one of the first, second, or third widths $w_1$, $w_2$, $w_3$ is different.

Figure 8:
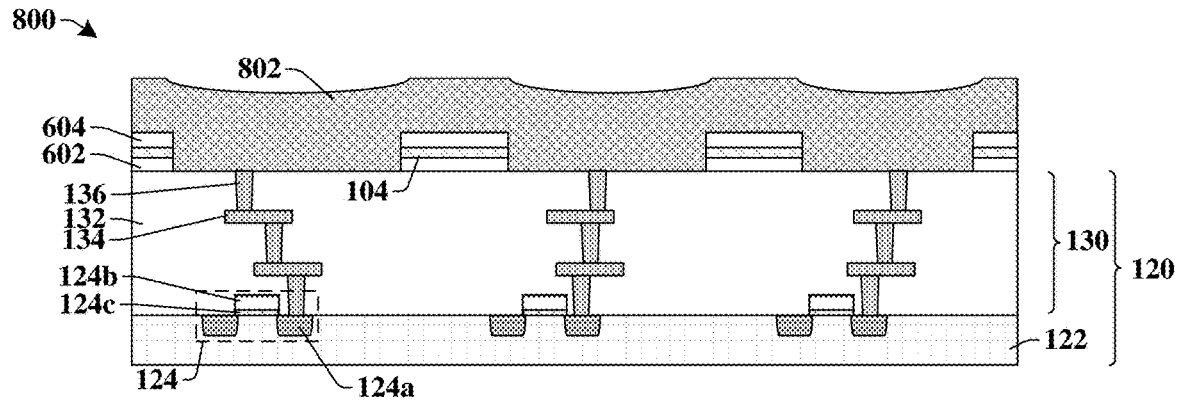

As shown in the cross-sectional view 800 of FIG. 8, a conductive material 802 may be deposited over the interconnect structure 130, such that the conductive material 802 fills in the cavities (702 of FIG. 7). In some embodiments, the conductive material 802 comprises a metal that is both electrically conductive and optically reflective. For example, in some embodiments, the conductive material 802 may comprise aluminum or aluminum copper. The conductive material 802 may be deposited over the interconnect dielectric structure 132 using a deposition process (e.g., physical vapor deposition (PVD), chemical vapor deposition (CVD), PE-CVD, atomic layer deposition (ALD), sputtering, etc.). In some embodiments, the conductive material 802 overfills the cavities (702 of FIG. 7), such that the conductive material 802 has top surfaces above the second dielectric layer 604.

Figure 9:
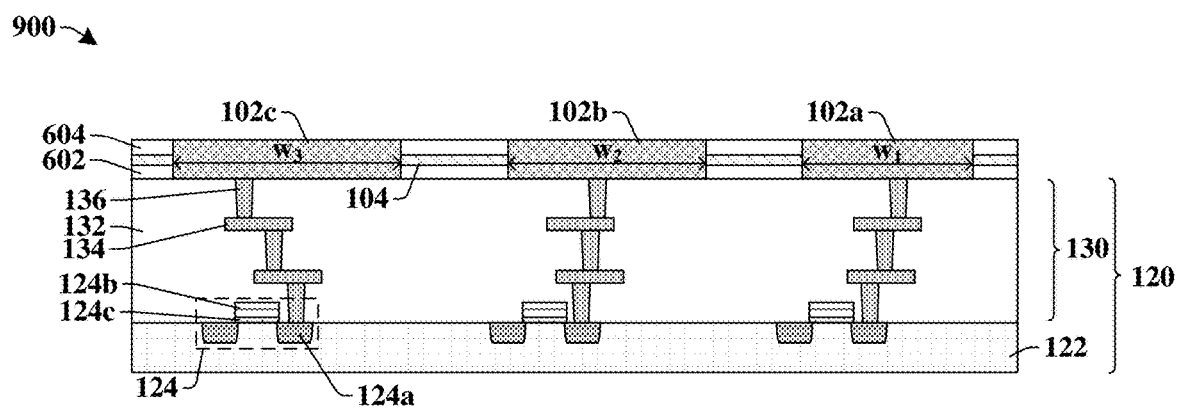

As shown in the cross-sectional view 900 of FIG. 9, a planarization process (e.g., chemical mechanical planarization (CMP)) is performed to remove portions of the conductive material (802 of FIG. 8) that are above the second dielectric layer 604, thereby forming a first reflector electrode 102a, a second reflector electrode 102b, and a third reflector electrode 102c. The first reflector electrode 102a may have the first width $w_1$, the second reflector electrode 102b may have the second width $w_2$, and the third reflector electrode 102c may have the third width $w_3$. The first, second, and third reflector electrodes 102a, 102b, 102c may have upper surfaces that are substantially co-planar with one another. Further, the first, second, and third reflector electrodes 102a, 102b, 102c may have upper surfaces that are substantially co-planar with the second dielectric layer 604.

In other embodiments, the planarization process may remove the second dielectric layer 604, for example, and thus, the first, second, and third reflector electrodes 102a, 102b, 102c may have upper surfaces that are substantially co-planar with the first barrier structures 104. The first, second, and third reflector electrodes 102a, 102b, 102c may each be coupled to a different one of the semiconductor devices 124, in some embodiments. Further, each of the first, second, and third reflector electrodes 102a, 102b, 102c may be laterally spaced apart from one another and electrically isolated by one another by the first barrier structures 104.

In some embodiments, after the planarization process, the first reflector electrode 102a may have a first average surface roughness, the second reflector electrode 102b may have a second average surface roughness, and the third reflector electrode 102c may have a third average surface roughness. In some embodiments, the first, second, and third average surface roughness may be substantially equal to one another, as each reflector electrode (102a, 102b, 102c) comprises a same material and is formed simultaneously using a same process method (e.g., deposition of the conductive material 802 of FIG. 8 followed by a planarization process). Because the reflector electrodes (102a, 102b, 102c) have an optical function to reflect light, a low average surface roughness is preferred to mitigate the scattering of light upon reflection. In some embodiments, to measure average surface roughness, a roughness measurement tool (e.g., a profilometer, atomic force microscopy (AFM), etc.) calculates a mean line along a surface and measures the deviation between the height of a peak or valley on the surface from the mean line. After measuring many deviations at many peaks and valleys throughout the surface, the average surface roughness is calculated by taking the mean of the many deviations, where the deviations are absolute values. In other embodiments, the surface roughness is quantified by measuring a total thickness variation (TTV). The TTV of a layer is the difference between the smallest thickness and the largest thickness of the layer. The TTV is measured throughout the length of a layer.

Figure 10:
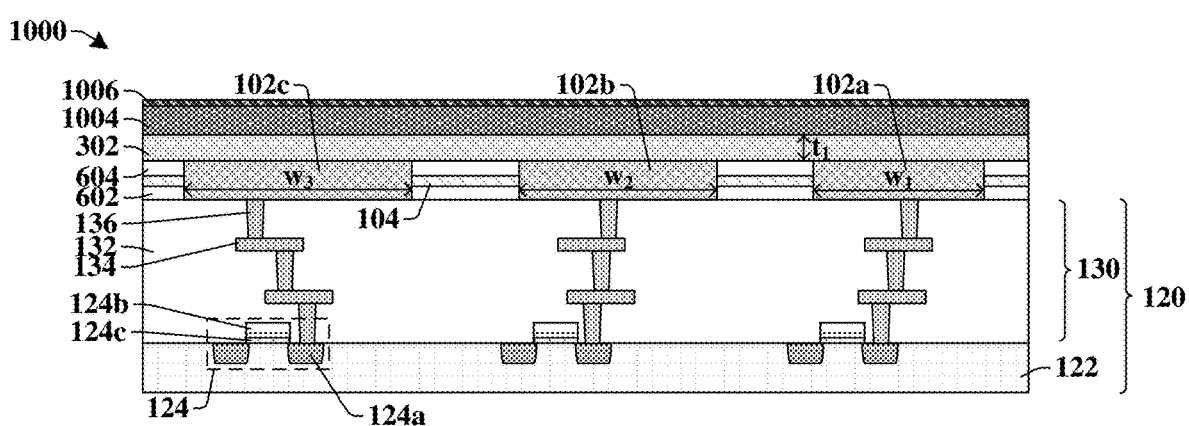

As shown in the cross-sectional view 1000 of FIG. 10, a first isolation layer 302 may be formed over the first, second, and third reflector electrodes 102a, 102b, 102c. In some embodiments, the first isolation layer 302 may comprise a material that has optical properties such that such that colored light is visible from the surface of the material, and wherein the colored light is dependent on the thickness of the first isolation layer 302. In some embodiments, the first isolation layer 302 may comprise, for example, an oxide, such as aluminum oxide or silicon dioxide. The first isolation layer 302 may have a first thickness $t_1$, and in some embodiments, the first thickness $t_1$ may be in a range of between, for example, approximately 200 angstroms and approximately 600 angstroms. In other embodiments, the first thickness $t_1$ may be in a range of between, for example approximately 49 angstroms and approximately 51 angstroms. In such other embodiments, because the first isolation layer 302 may be thin (e.g., less than 100 angstroms), the first isolation layer 302 may comprise aluminum oxide that is deposited by atomic layer deposition (ALD), which allows for precise control of the first thickness $t_1$. In some embodiments, the first isolation layer 302 may be formed using a different deposition process than ALD, such as physical vapor deposition (PVD), chemical vapor deposition (CVD), PE-CVD, sputtering. The first isolation layer 302 may directly contact the first, second, and third reflector electrodes 102a, 102b, 102c.

Further, a first conformal masking layer 1004 may be deposited over the first isolation layer 302. The first conformal masking layer 1004 may comprise, for example, titanium, titanium nitride, tantalum, tantalum nitride, silicon nitride, or the like. Thus, the first conformal masking layer 1004 may be deposited using a deposition process (e.g., physical vapor deposition (PVD), chemical vapor deposition (CVD), PE-CVD, atomic layer deposition (ALD), sputtering, etc.).

Figure 11:
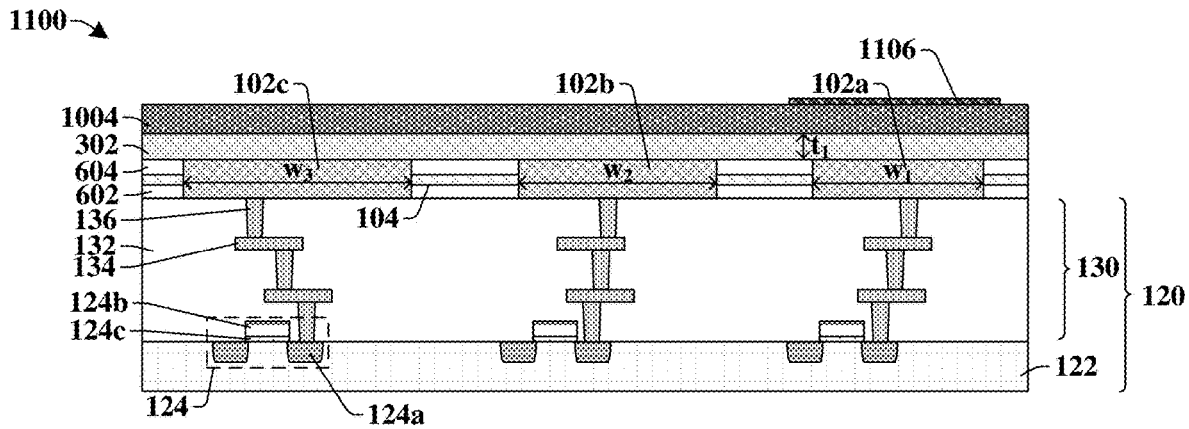
Figure 12:
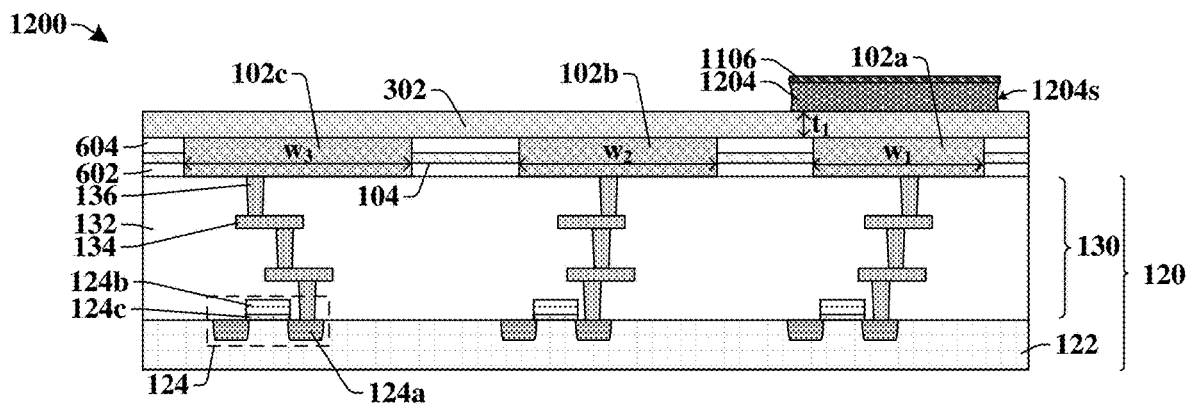

In some embodiments, a first conformal oxide layer 1006 may be formed over the first conformal masking layer 1004. The first conformal oxide layer 1006 may be used to more precisely pattern the first conformal masking layer 1004, as illustrated in FIGS. 11 and 12. However, it will be appreciated that in some embodiments, the first conformal oxide layer 1006 may be omitted. In some embodiments, the first conformal oxide layer 1006 may comprise an oxide material such as, for example, silicon dioxide, silicon oxynitride, aluminum oxide, or the like. The first conformal oxide layer 1006 may, in some embodiments, be formed by using a deposition process (e.g., physical vapor deposition (PVD), chemical vapor deposition (CVD), PE-CVD, atomic layer deposition (ALD), sputtering, etc.).

As shown in the cross-sectional view 1100 of FIG. 11, the first conformal oxide layer (1006 of FIG. 10) may be selectively patterned to form a first oxide layer 1106 over the first conformal masking layer 1004. The first oxide layer 1106 is formed to directly overlie the first reflector electrode 102a, and without directly overlying the second or third reflector electrodes 102b, 102c. Further, in some embodiments, the first oxide layer 1106 completely overlies the first reflector electrode 102a, and thus, the first oxide layer 1106 may have a width that is about equal to or greater than the first width $w_1$ of the first reflector electrode 102a.

In some embodiments, the first oxide layer 1106 may be formed by, for example, a photolithography/etching process or some other suitable process. In some embodiments, a dry etching process may be used to form the first oxide layer 1106, and the first conformal masking layer 1004 may block the passage of ions during the dry etching process, thereby protecting the underlying first isolation layer 302 and first, second, and third reflector electrodes 102a, 102b, 102c from damage due to dry etching.

As shown in the cross-sectional view 1200 of FIG. 12, portions of the first conformal masking layer (1004) that are uncovered by the first oxide layer 1106 may be removed to form a first masking layer 1204. Thus, in some embodiments, the first oxide layer 1106 acts as a mask to form the first masking layer 1204. In some embodiments, a wet etching process is used to remove portions of the first conformal masking layer (1004). The wet etching process may use a wet etchant comprising, for example, hydrogen peroxide. The wet etchant used in the wet etching process does not remove or affect the first isolation layer 302, the second reflector electrode 102b, and the third reflector electrode 102c. Thus, the first isolation layer 302, the second reflector electrode 102b, and the third reflector electrode 102c may remain substantially unchanged during the formation of the first oxide layer 1106 and of the first masking layer 1204. If dry etching were used, ions from the dry etching may pass through the first isolation layer 302 and impinge on the second reflector electrode 102b and the third reflector electrode 102c. This may lead to damage (e.g., composition defects, structural defects, etc.) to the first isolation layer 302, the second reflector electrode 102b, and the third reflector electrode 102c. Such damage may, in turn, lead to light scattering and hence negatively affect the reliability of the display device. In some embodiments, the first masking layer 1204 may have curved outer sidewalls 1204s as a result of the lateral effect of the wet etching process.

Figure 13:
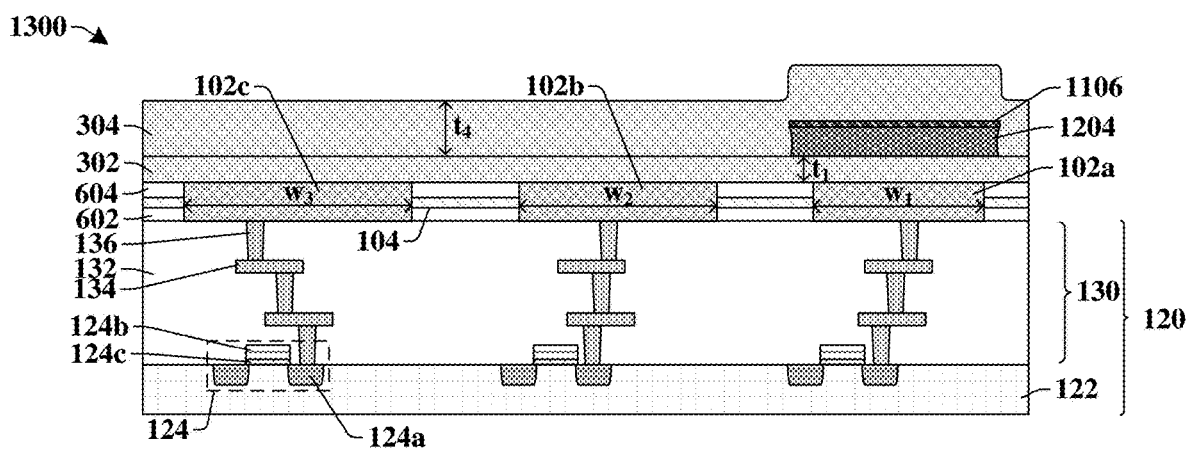

As shown in the cross-sectional view 1300 of FIG. 13, a second isolation layer 304 may be formed over the first isolation layer 302 and the first masking layer 1204. In some embodiments, the second isolation layer 304 may comprise a same or different material than the first isolation layer 302. In some embodiments, the second isolation layer 304 may comprise, for example, an oxide, such as aluminum oxide or silicon dioxide.

The second isolation layer 304 may have a fourth thickness $t_4$, and in some embodiments, the fourth thickness $t_4$ may be in a range of between, for example, approximately 200 angstroms and approximately 800 angstroms. In some other embodiments, the fourth thickness $t_4$ may be in a range of between, for example, approximately 800 angstroms and approximately 1000 angstroms. In some embodiments, the fourth thickness $t_4$ is less than, greater than, or about equal to the first thickness $t_1$ of the first isolation layer 302. For example, in the cross-sectional view 1300, the fourth thickness $t_4$ is greater than the first thickness $t_1$. The second isolation layer 304 may be formed using a deposition process (e.g., physical vapor deposition (PVD), chemical vapor deposition (CVD), PE-CVD, atomic layer deposition (ALD), sputtering, etc.). The second isolation layer 304 may directly contact the first isolation layer 302. In some embodiments, if the first and second isolation layers 302, 304 comprise a same material, an interface between the first and second isolation layers 302, 304 may not be distinguishable.

Figure 14:
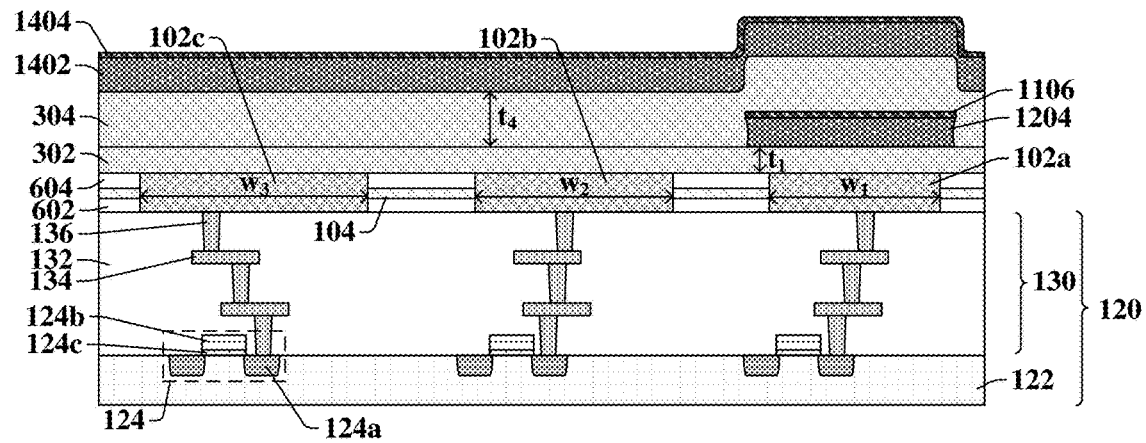

As shown in the cross-sectional view 1400 of FIG. 14, a second conformal masking layer 1402 may be formed over the second isolation layer 304. In some embodiments, the second conformal masking layer 1402 may comprise the same material and may be deposited using the same deposition process as the first conformal masking layer (1004 of FIG. 10). Further, in some embodiments, a second conformal oxide layer 1404 may be deposited over the second conformal masking layer 1402. In some embodiments, the second conformal oxide layer 1404 may comprise the same material and may be deposited using the same deposition process as the first conformal oxide layer (1006 of FIG. 10).

Figure 15:
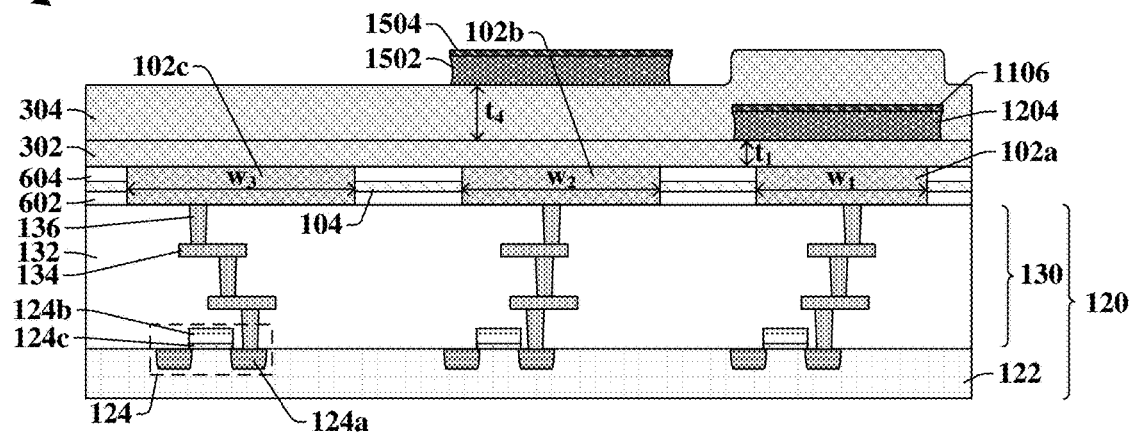

As shown in the cross-sectional view 1500 of FIG. 15, the second conformal oxide layer (1404 of FIG. 14) and the second conformal masking layer (1402 of FIG. 14) may be patterned such that a second masking layer 1502 and a second oxide layer 1504 directly overlie the second reflector electrode 102b without directly overlying the first or third reflector electrodes 102a, 102c. The patterning of the second oxide layer 1504 and the second masking layer 1502 may be conducted using the same or similar steps are presented in FIGS. 11 and 12 regarding the formation of the first oxide layer 1106 arranged over the first masking layer 1204. Further, in some embodiments, the second oxide layer 1504 and the second masking layer 1502 completely overlie the second reflector electrode 102b, and thus, the second oxide layer 1504 and the second masking layer 1502 may each have a width that is about equal to or greater than the second width $w_2$ of the second reflector electrode 102b. Further, similar to the first isolation layer 302 during the formation of the first masking layer 1204, the second isolation layer 304 remains substantially unchanged during the formation of the second masking layer 1502 because the second masking layer 1502 prevents the passage of ions and is patterned using a wet etching process, in some embodiments.

Figure 16:
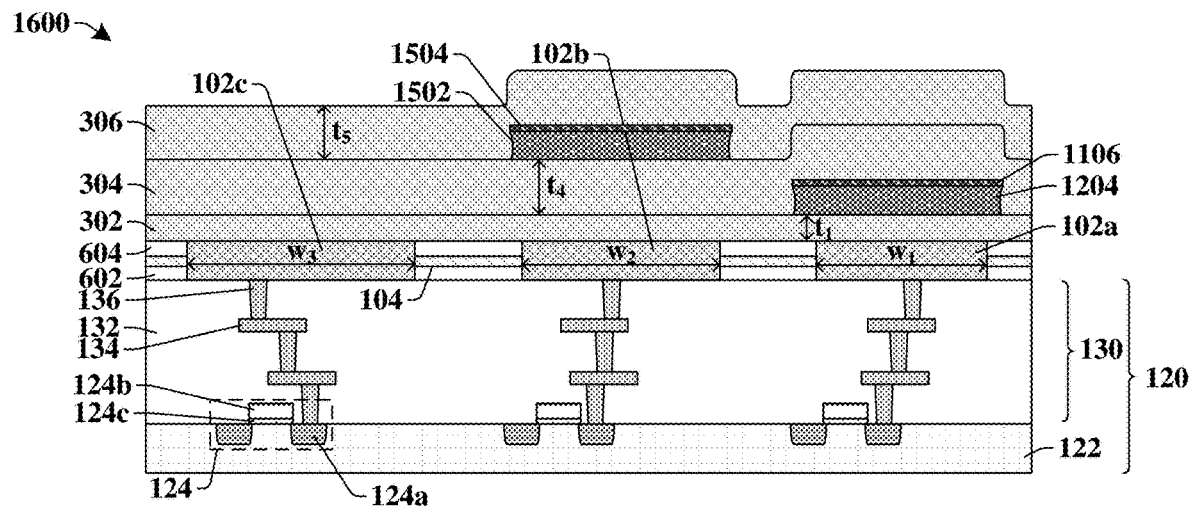

As shown in the cross-sectional view 1600 of FIG. 16, a third isolation layer 306 may be formed over the second isolation layer 304 and the second masking layer 1502. In some embodiments, the third isolation layer 306 may comprise a same or different material than the first isolation layer 302 and/or the second isolation layer 304. In some embodiments, the third isolation layer 306 may comprise, for example, an oxide, such as aluminum oxide or silicon dioxide.

The third isolation layer 306 may have a fifth thickness $t_5$, and in some embodiments, the fifth thickness $t_5$ may be in a range of between, for example, approximately 200 angstroms and approximately 1100 angstroms. In some other embodiments, the fifth thickness $t_5$ may be in a range of between, for example, approximately 1100 angstroms and approximately 1300 angstroms. In some embodiments, the fifth thickness $t_5$ is less than, greater than, or about equal to the fourth thickness $t_4$ of the second isolation layer 304. For example, in the cross-sectional view 1600, the fifth thickness $t_5$ is about equal to the fourth thickness $t_4$. The third isolation layer 306 may be formed using a deposition process (e.g., physical vapor deposition (PVD), chemical vapor deposition (CVD), PE-CVD, atomic layer deposition (ALD), sputtering, etc.). The third isolation layer 306 may directly contact the second isolation layer 304. In some embodiments, if the second and third isolation layers 304, 306 comprise a same material, an interface between the second and third isolation layers 304, 306 may not be distinguishable.

Figure 17:
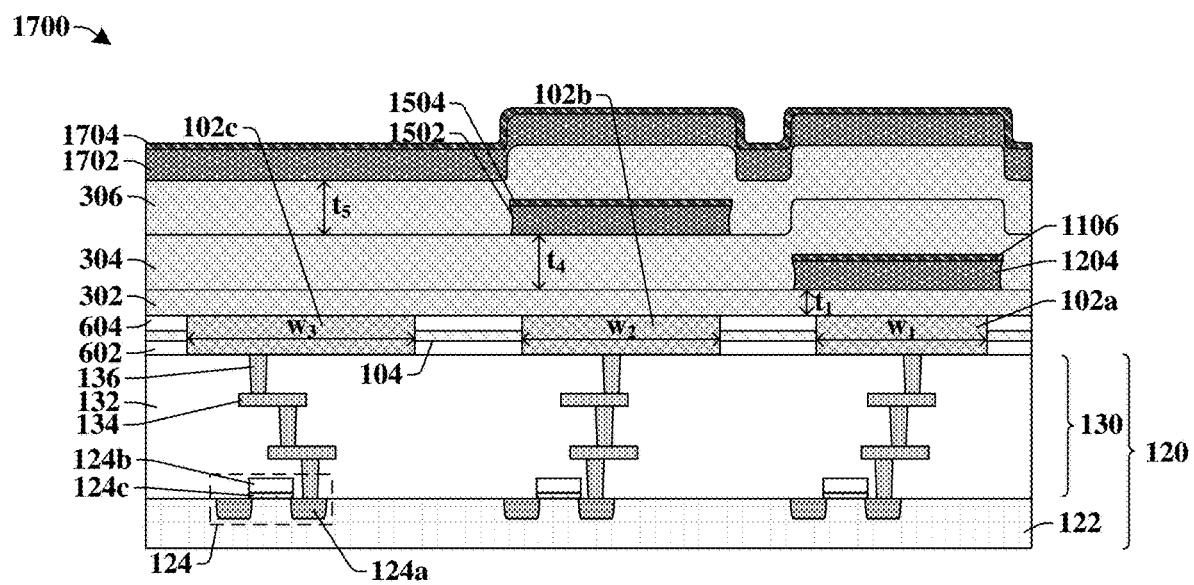

As shown in the cross-sectional view 1700 of FIG. 17, a third conformal masking layer 1702 may be formed over the third isolation layer 306. In some embodiments, the third conformal masking layer 1702 may comprise the same material and may be deposited using the same deposition process as the first conformal masking layer (1004 of FIG. 10). Further, in some embodiments, a third conformal oxide layer 1704 may be deposited over the third conformal masking layer 1702. In some embodiments, the third conformal oxide layer 1704 may comprise the same material and may be deposited using the same deposition process as the first conformal oxide layer (1006 of FIG. 10).

Figure 18:
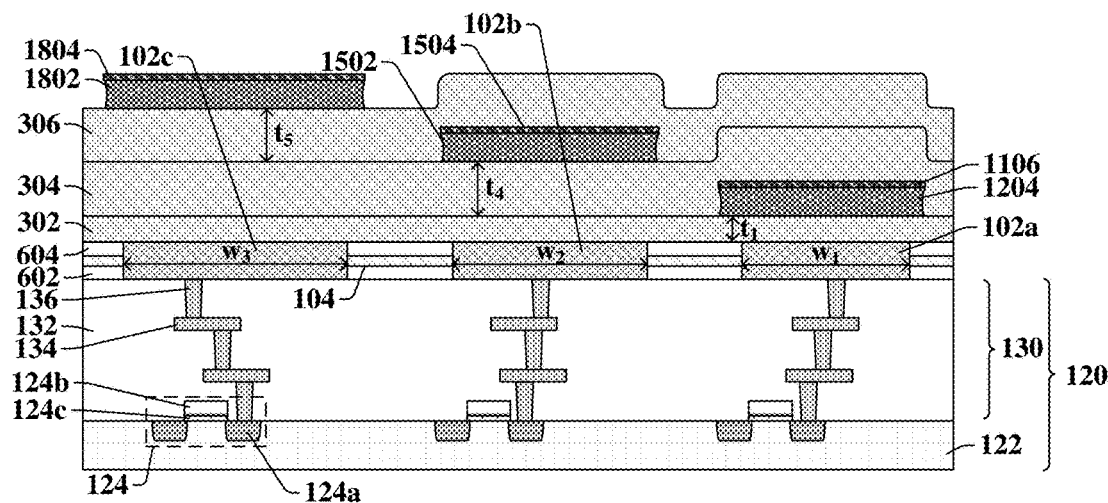

As shown in the cross-sectional view 1800 of FIG. 18, the third conformal oxide layer (1704 of FIG. 17) and the third conformal masking layer (1702 of FIG. 17) may be patterned such that a third masking layer 1802 and a third oxide layer 1804 directly overlie the third reflector electrode 102c without directly overlying the second or third reflector electrodes 102b, 102c. The patterning of the third oxide layer 1804 and the third masking layer 1802 may be conducted using the same or similar steps are presented in FIGS. 11 and 12 regarding the formation of the first oxide layer 1106 arranged over the first masking layer 1204. Further, in some embodiments, the third oxide layer 1804 and the third masking layer 1802 completely overlie the third reflector electrode 102c, and thus, the third oxide layer 1804 and the third masking layer 1802 may each have a width that is about equal to or greater than the third width $w_3$ of the third reflector electrode 102c. Further, similar to the first isolation layer 302 during the formation of the first masking layer 1204, the third isolation layer 306 remains substantially unchanged during the formation of the third masking layer 1802 because the third masking layer 1802 prevents the passage of ions and is patterned using a wet etching process, in some embodiments.

Figure 19A:
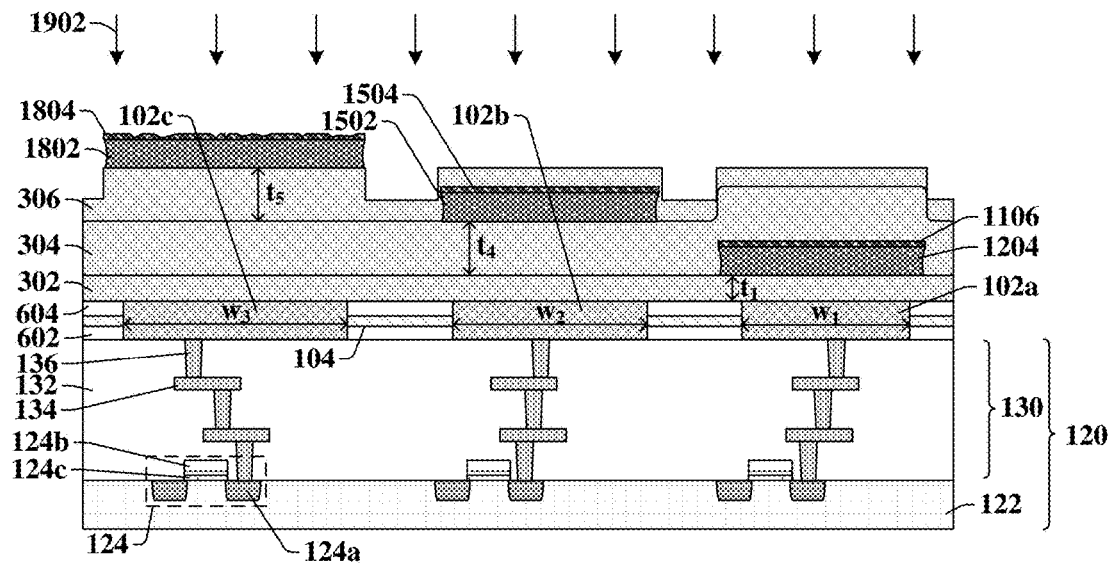
Figure 19B:
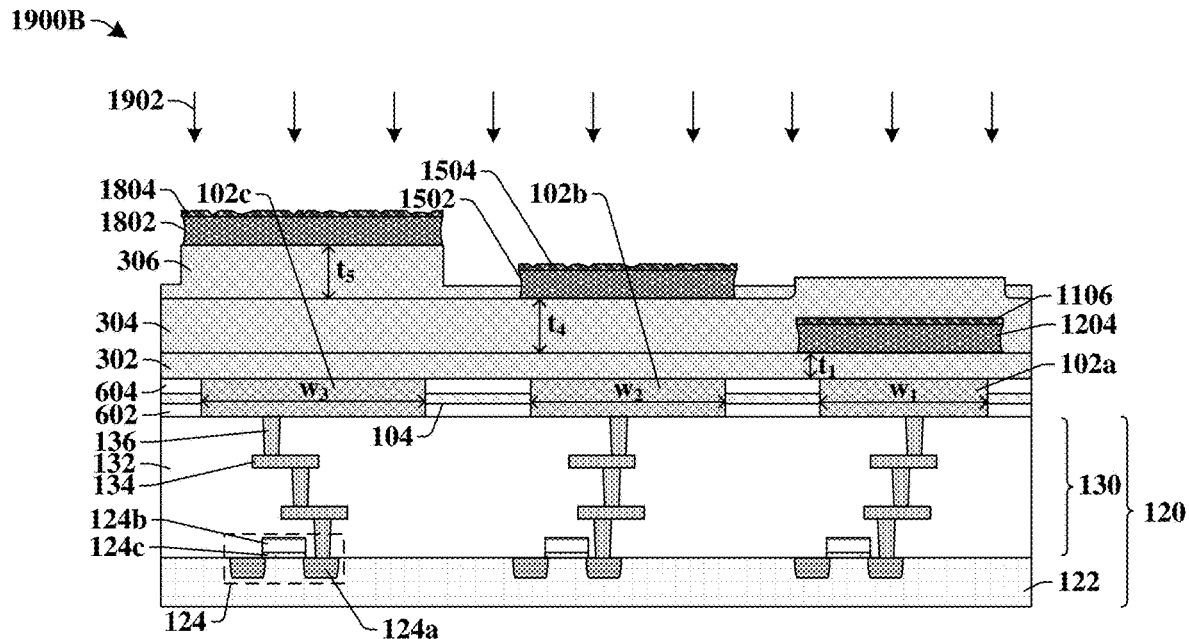
Figure 19C:
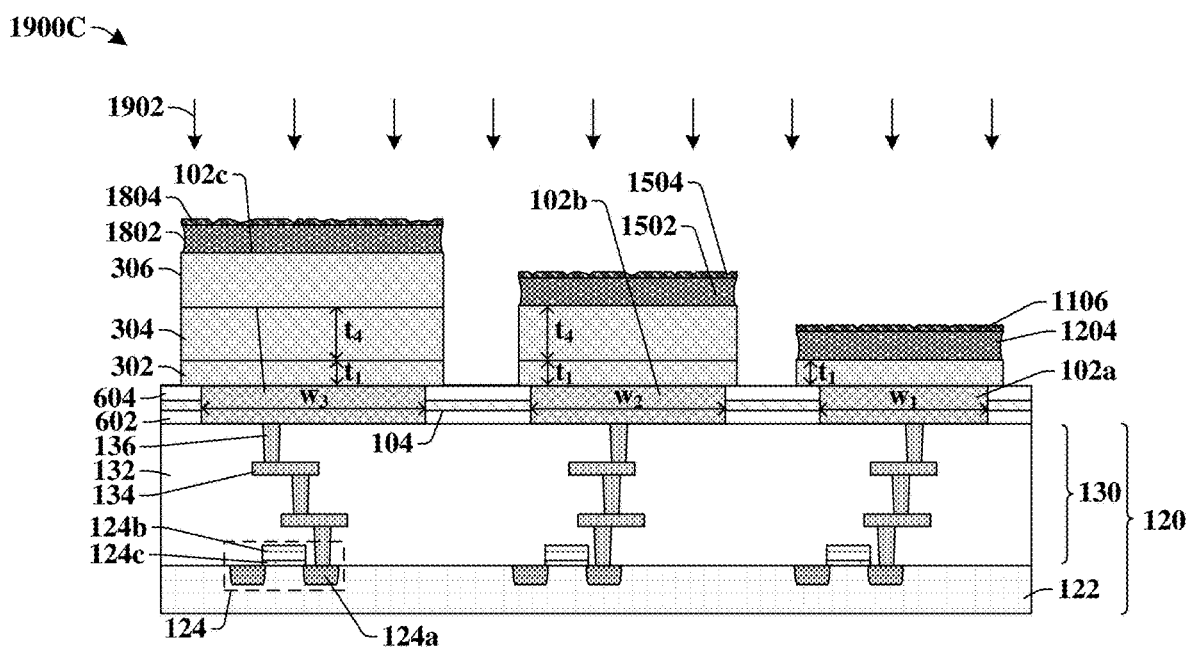

As shown in the cross-sectional views 1900A-1900C of FIGS. 19A-19C, a first removal process 1902 is performed to remove portions of the first, second, and third isolation layers 302, 304, 306 uncovered by the first, second, and third masking layers 1204, 1502, 1802. The cross-sectional views 1900A, 1900B, and 1900C of FIGS. 19A, 19B, and 19C illustrate the first removal process 1902 respectively at a first time, a second time, and a third time, where the second time is after the first time and the third time is after the second time.

During the first time, as illustrated in the cross-sectional view 1900A of FIG. 19A, the third isolation layer 306 that is uncovered by the third masking layer 1802 is removed. In some embodiments, the first removal process 1902 uses a vertical etch. Thus, in some embodiments, the first removal process 1902 is an etching process that utilizes a dry etchant. The dry etchant does not remove the first, second, or third masking layers 1204, 1502, 1802. In some embodiments, the first oxide layer 1106, the second oxide layer 1504, and the third oxide layer 1804 comprise a same material as the first, second, and/or third isolation layers 302, 304, 306. In some embodiments, the first removal process 1902 may partially remove the first, second, and third oxide layers 1106, 1504, 1804 such that after the first removal process 1902, the first, second, and third oxide layers 1106, 1504, 1804 may have a higher average surface roughness than before the first removal process 1902. In other embodiments (not illustrated), the first removal process 1902 may completely remove the first oxide layer 1106, the second oxide layer 1504, and the third oxide layer 1804. Nevertheless, the first, second, and third masking layers 1204, 1502, 1802 cover and protect the underlying first, second, and/or third isolation layers 302, 304, 306 from ions during the dry etch.

During the second time, as illustrated in the cross-sectional view 1900B of FIG. 19B, the first removal process 1902 begins to remove portions of the second isolation layer 304 uncovered by the second and third masking layers 1502, 1802. In some embodiments, the same dry etchant is used during the first removal process 1902. In other embodiments, such as if the first, second, and/or third isolation layers 302, 304, 306 comprise different materials, different dry etchants may be used to effectively remove each of the first, second, and third isolation layers 302, 304, 306 that are uncovered or that do not directly underlie the first, second, or third masking layers 1204, 1502, 1802. For example, in some embodiments, for an oxide-based first, second and/or third isolation layer 302, 304, 306, a carbon fluoride based dry etchant may be used, whereas in some other embodiments, for a nitride-based first, second, and/or third isolation layer 302, 304, 306, a carbon hydrogen fluoride based dry etchant may be used. It will be appreciated that other dry etchants are also within the scope of the disclosure.

During the third time, as illustrated in the cross-sectional view 1900C of FIG. 19C, the first removal process 1902 finishes and removes portions of the first, second, and third isolation layers 302, 304, 306 that do not directly underlie the first, second, or third masking layers 1204, 1502, 1802. The first removal process 1902 may stop at the second dielectric layer 604 or at the first barrier structures 104. Because the first, second, and third masking layers 1204, 1502, 1802 completely overlie the first, second, and third reflector electrodes 102a, 102b, 102c, respectively, the first, second, and third reflector electrodes 102a, 102b, 102c do not get damaged by the first removal process 1902 and therefore maintain the first, second, and third average surface roughnesses, respectively. Thus, patterning of the first, second, and third isolation layers 302, 304, 306 does not damage the first, second, and third reflector electrodes 102a, 102b, 102c and optical properties of the first, second, and third reflector electrodes 102a, 102b, 102c are maintained.

Figure 20:
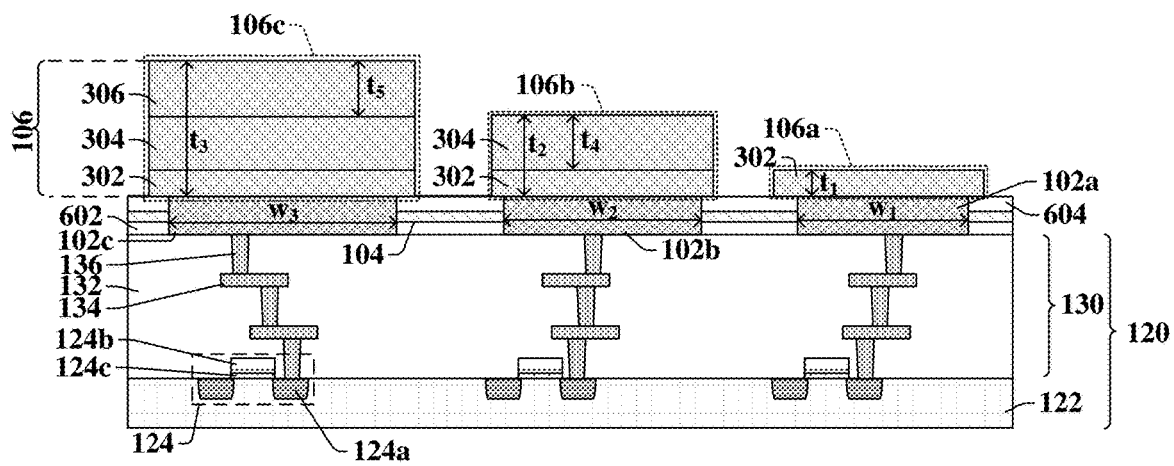

As shown in the cross-sectional view 2000 of FIG. 20, a second removal process may be performed to remove the first, second, and third masking layers (1204, 1502, 1802 of FIG. 19C). Further, in some embodiments, the second removal process also remove the first oxide layer (1106 of FIG. 19C), the second oxide layer (1504 of FIG. 19C), and the third oxide layer (1804 of FIG. 19C). The second removal process, in some embodiments, may comprise, for example, a dry etching process to remove the first oxide layer (1106 of FIG. 19C), the second oxide layer (1504 of FIG. 19C), and the third oxide layer (1804 of FIG. 19C) followed by a wet etching process to remove the first, second, and third masking layers (1204, 1502, 1802 of FIG. 19C). In other embodiments, where the first oxide layer (1106 of FIG. 19C), the second oxide layer (1504 of FIG. 19C), and the third oxide layer (1804 of FIG. 19C) were omitted or where the first oxide layer (1106 of FIG. 19C), the second oxide layer (1504 of FIG. 19C), and the third oxide layer (1804 of FIG. 19C) were removed during the first removal process (1902 of FIGS. 19A, 19B, 19C), for example, the second removal process may only comprise a wet etching process to remove the first, second, and third masking layers (1204, 1502, 1802 of FIG. 19C).

Wet etching is used in place of dry etching to prevent damage to the first, second, and third isolation layers 302-306 and the first, second, and third reflector electrodes 102a-102c. If dry etchants were employed, ions from the dry etching may pass through the first, second, and third isolation layers 302-306 to upper surfaces respectively of the first, second, and third reflector electrodes 102a-102c. This would damage the crystalline structure of the first, second, and third isolation layers 302-306 and would increase upper surface roughness of the first, second, and third reflector electrodes 102a-102c. The crystalline damage and/or increased surface damage would, in turn, increase light scattering and degrade reliability of the display device.

The first, second, and third isolation layers 302, 304, 306 form an isolation structure 106 coupled to the control circuitry 120. A first portion 106a of the isolation structure 106 comprises the first isolation layer 302. The first portion 106a of the isolation structure 106 has the first thickness $t_1$. A second portion 106b of the isolation 106 structure comprises portions respectively of the first isolation layer 302 and the second isolation layer 304 that directly overlie the second reflector electrode 102b. The first isolation layer 302 of the second portion 106b of the isolation structure directly contacts the second reflector electrode 102b. The second portion 106b of the isolation structure 106 has a second thickness $t_2$ that in some embodiments, is in a range of between, for example, approximately 300 angstroms and approximately 1300 angstroms. The second thickness $t_2$ is greater than the first thickness $t_1$, such that an upper surface of the first portion 106a of the isolation structure 106 is below an upper surface of the second portion 106b of the isolation structure 106. The second thickness $t_2$ is equal a sum of the first thickness $t_1$ and the fourth thickness $t_4$. A third portion 106c of the isolation structure 106 directly overlies the third reflector electrode 102c and comprises portions respectively of the first isolation layer 302, the second isolation layer 304, and the third isolation layer 306. The first isolation layer 302 of the third portion 106c of the isolation structure directly contacts the third reflector electrode 102c. The third portion 106c of the isolation structure 106 has a third thickness $t_3$ that, in some embodiments, is in a range of between, for example, approximately 400 angstroms and approximately 1500 angstroms. The third thickness $t_3$ is equal to a sum of the first thickness $t_1$, the second thickness $t_2$, and the third thickness $t_3$. The third thickness $t_3$ may be greater than the second thickness $t_2$, such that the upper surface of the second portion 106b of the isolation structure 106 is below an upper surface of the third portion 106c of the isolation structure 106. The first, second, and third portions 106a, 106b, 106c of the isolation structure 106 are completely laterally spaced apart from one another, allowing for optical isolation.

Figure 21:
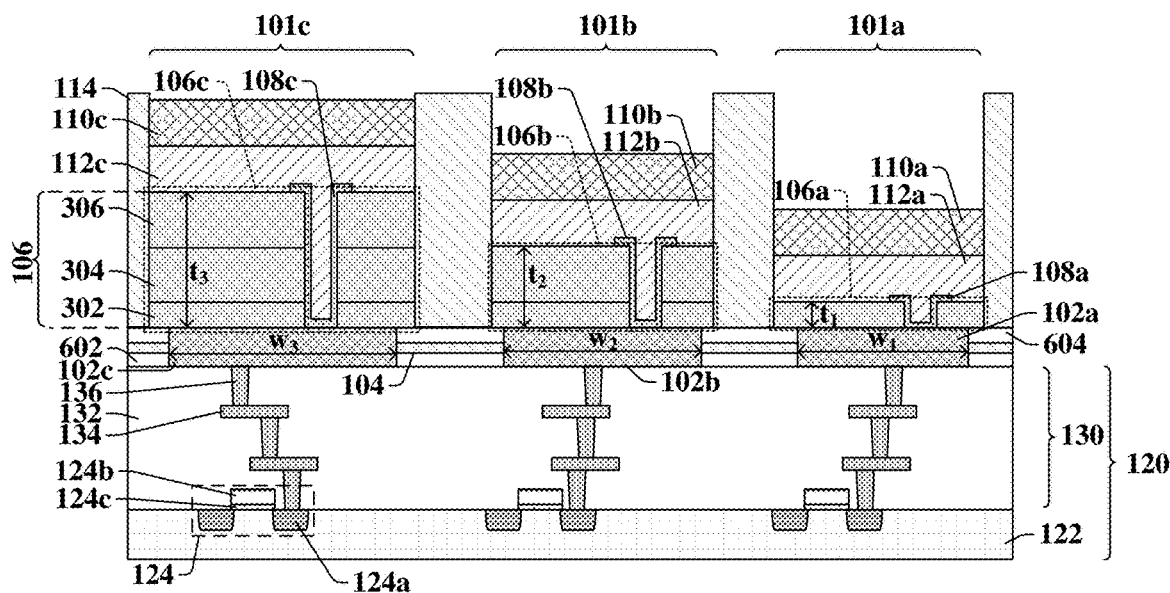

As shown in the cross-sectional view 2100 of FIG. 21, first, second, and third via structures 108a, 108b, 108c are formed over and extending through the first, second, and third portions 106a, 106b, 106c of the interconnect structure, respectively, to contact the first, second, and third reflector electrodes 102a, 102b, 102c, respectively. In some embodiments, the via structures (108a, 108b, 108c) may comprise tantalum, titanium, or some other conductive material.

Further, in some embodiments, first, second, and third transparent electrodes 112a, 112b, 112c may be formed over the first, second, and third portions 106a, 106b, 106c of the isolation structure 106, respectively. The first transparent electrode 112a may directly contact the first portion 106a of the isolation structure 106. The second transparent electrode 112b may directly contact the second portion 106b of the isolation structure 106. The third transparent electrode 112c may directly contact the third portion 106c of the isolation structure 106. In some embodiments, the transparent electrodes (112a, 112b, 112c) comprise an electrically conductive material that is also optically transparent, such as, for example, indium tin oxide (ITO), fluorine tin oxide (FTO), or the like. In some embodiments, each of the transparent electrodes (112a, 112b, 112c) may have a thickness that is, for example, in a range of between approximately 500 angstroms and approximately 3000 angstroms.

In some embodiments, a first optical emitter structure 110a, a second optical emitter structure 110b, and a third optical emitter structure 110c may be respectively formed over the first transparent electrode 112a, the second transparent electrode 112b, and the third transparent electrode 112c. In some embodiments, the optical emitter structures (110a, 110b, 110c) may be or comprise an organic light emitting diode (OLED) or some other suitable light generating device. In some embodiments, each of the optical emitter structures (110a, 110b, 110c) may have a thickness in the range of between, for example, approximately 500 angstroms and approximately 3000 angstroms.

In some embodiments, second barrier structures 114 are formed to separate the transparent electrodes (112a, 112b, 112c) and the optical emitter structures (110a, 110b, 110c) to define a first pixel region 101a, a second pixel region 101b, and a third pixel region 101c. Further, the second barrier structures 114 may completely separate the first, second, and third portions 106a, 106b, 106c of the isolation structure 106. It will be appreciated that the display device may comprise an array of pixel regions, and may comprise more than the first, second, and third pixel regions 101a, 101b, 101c. Some of the second barrier structures 114 may directly overlie the first barrier structures 104, and the second barrier structures 114 may comprise a dielectric material to electrically and optically isolate the pixel regions (101a, 101b, 101c) from one another. For example, the second barrier structures 114 may comprise a nitride (e.g., silicon nitride, silicon oxynitride), an oxide (e.g., silicon oxide), or the like. For example, in some other embodiments, the second barrier structures 114 may comprise a multi-layer film stack of silicon nitride and silicon oxide. Further, in some embodiments, the second barrier structures 114 may comprise a same material as the isolation structure 106, the first barrier structures 104, and/or the interconnect dielectric structure 132. In other embodiments, the second barrier structures 114 may comprise a different material as the isolation structure 106, the first barrier structures 104, and/or the interconnect dielectric structure 132.

It will be appreciated that the via structures (108a, 108b, 108c), the transparent electrodes (112a, 112b, 112c), the optical emitter structures (110a, 110b, 110c), and the second barrier structures 114 may each be formed through various steps comprising deposition processes (e.g., physical vapor deposition (PVD), chemical vapor deposition (CVD), PE-CVD, atomic layer deposition (ALD), sputtering, etc.), removal processes (e.g., wet etching, dry etching, chemical mechanical planarization (CMP), etc.), and/or patterning processes (e.g., photolithography/etching).

Thus, the display device comprises control circuitry 120 to selectively operate the first, second, and third pixel regions 101a, 101b, 101c. Because the first, second, and third reflector electrodes 102a, 102b, 102c are protected from the first removal process (1902 of FIGS. 19A, 19B, 19C) by the first, second, and third masking layers 1204, 1502, 1802, respectively, each of the pixel regions (101a, 101b, 101c) may be selectively operated by the control circuitry 120 to reliably emit colored light depending on the thicknesses ($t_1$, $t_2$, $t_3$) and/or materials of each portion (106a, 106b, 106c) of the isolation structure (106).

Figure 22:
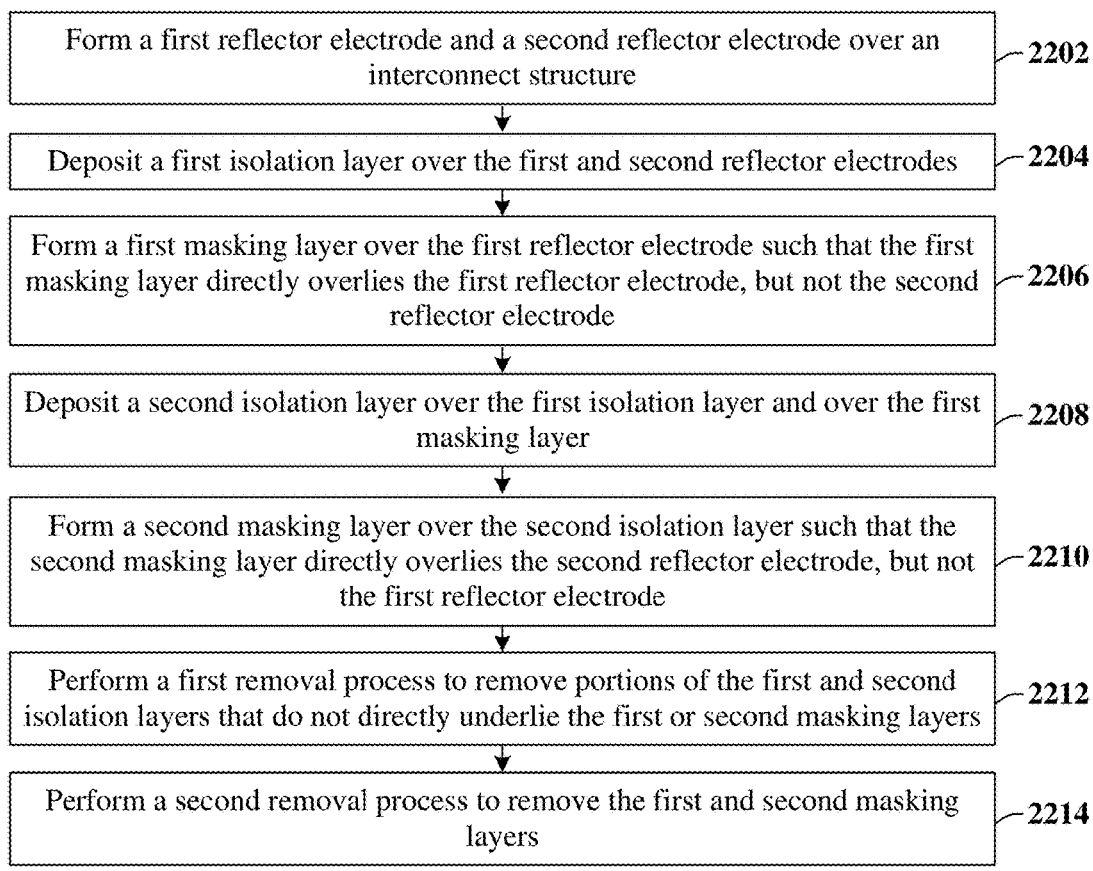
FIG. 22 illustrates a flow diagram of some embodiments of a method corresponding to FIGS. 5-18, 19A-19C, 20, and 21.

FIG. 22 illustrates a flow diagram of some embodiments of a method 2200 corresponding to FIGS. 5-18, 19A-19C, 20, and 21.

While method 2200 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At act 2202, a first reflector electrode and a second reflector electrode are formed over an interconnect structure. FIGS. 7-9 illustrate cross-sectional views 700-900 of some embodiments corresponding to act 2202.

At act 2204, a first isolation layer is deposited over the first and second reflector electrodes. FIG. 10 illustrates cross-sectional view 1000 of some embodiments corresponding to act 2204.

At act 2206, a first masking layer is formed over the first reflector electrode such that the first masking layer directly overlies the first reflector electrode but not the second reflector electrode. FIGS. 10-12 illustrate cross-sectional views 1000-1200 of some embodiments corresponding to act 2206.

At act 2208, a second isolation layer is deposited over the first isolation layer and over the first masking layer. FIG. 13 illustrates cross-sectional view 1300 of some embodiments corresponding to act 2208.

At act 2210, a second masking layer is formed over the second isolation layer such that the second masking layer directly overlies the second reflector electrode but not the first reflector electrode. FIGS. 14 and 15 illustrate cross-sectional views 1400 and 1500, respectively, of some embodiments corresponding to act 1910.

At act 2212, a first removal process is performed to remove portions of the first and second isolation layers that do not directly underlie the first or second masking layers. FIGS. 19A, 19B, and 19C illustrate cross-sectional views 1900A, 1900B, and 1900C, respectively, of some embodiments corresponding to act 2212.

At act 2214, a second removal process is performed to remove the first and second masking layers. FIG. 20 illustrates cross-sectional view 2000 of some embodiments corresponding to act 2214.

Therefore, the present disclosure relates to a method of forming an isolation structure that prevents damage to upper surfaces of an underlying reflector electrode structure to improve reliability of a display device.

Accordingly, in some embodiments, the present disclosure relates to a display device comprising: a first reflector electrode; a second reflector electrode that is separated from the first reflector electrode; an isolation structure overlying the first and second reflector electrodes, the isolation structure comprising: a first portion that overlies the first reflector electrode and has a first thickness, and a second portion that overlies the second reflector electrode, has a second thickness greater than the first thickness, and is separated from the first portion of the isolation structure; and a first optical emitter structure and a second optical emitter structure respectively overlying the first and second portions of the isolation structure.

In other embodiments, the present disclosure relates to a display device comprising: a first reflector electrode and a second reflector electrode over an interconnect structure; a first isolation layer comprising a pair of segments that are spaced from each other and that respectively overlie the first and second reflector electrodes; a second isolation layer overlying the first isolation layer and the second reflector electrode, but not the first reflector electrode; a first optical emitter structure overlying the first isolation layer and the first reflector electrode and a second optical emitter structure overlying the second isolation layer and the second reflector electrode; and a first conductive structure and a second conductive structure respectively extending from the first reflector electrode to the first optical emitter structure and from the second reflector electrode to the second optical emitter structure, wherein the first conductive structure extends through the first isolation layer, and wherein the second conductive structure extends through the first and second isolation layers.

In yet other embodiments, the present disclosure relates to a method of forming a display device, comprising: forming a first reflector electrode and a second reflector electrode over an interconnect structure, wherein the first reflector electrode is laterally separated from the second reflector electrode; depositing a first isolation layer over the first and second reflector electrodes; forming a first masking layer directly overlying the first reflector electrode; depositing a second isolation layer over the first isolation layer and over the first masking layer; forming a second masking layer over the second isolation layer and directly overlying the second reflector electrode; performing a first removal process to remove portions of the first and second isolation layers that do not directly underlie the first or second masking layers; and performing a second removal process to remove the first and second masking layers.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A display device comprising:
   a first reflector electrode;
   a second reflector electrode that is separated from the first reflector electrode;
   an isolation structure overlying the first and second reflector electrodes, the isolation structure comprising:
   a first portion that overlies the first reflector electrode and has a first thickness, and
   a second portion that overlies the second reflector electrode, has a second thickness greater than the first thickness, and is separated from the first portion of the isolation structure;
   a first optical emitter structure and a second optical emitter structure respectively overlying the first and second portions of the isolation structure, the first and second optical emitter structures having vertical outer sidewalls;
   a first barrier structure arranged laterally between the first and second reflector electrodes, the first barrier structure having a first barrier composition and having a first width defined between outer sidewalls of the first barrier structure;
   a second barrier structure directly overlying the first barrier structure and arranged laterally between the first and second portions of the isolation structure, the second barrier structure having a second barrier composition and having a second width defined between outer sidewalls of the second barrier structure, the second barrier composition differing from the first barrier composition;
   a first transparent electrode arranged between the first portion of the isolation structure and the first optical emitter structure; and
   a second transparent electrode arranged between the second portion of the isolation structure and the second optical emitter structure, wherein the second transparent electrode is electrically isolated from the first transparent electrode;
   wherein the first and second transparent electrodes have vertical outer sidewalls that are aligned with the vertical outer sidewalls of the first and second optical emitter structures; and
   wherein the vertical outer sidewalls of the first transparent electrode are more closely spaced than vertical outer sidewalls of the first portion of the isolation structure, and the vertical outer sidewalls of the second transparent electrode are more closely spaced than vertical outer sidewalls of the second portion of the isolation structure.

2. The display device of claim 1, wherein the first portion of the isolation structure contacts the first reflector electrode at a first interface, wherein the first portion of the isolation structure contacts the first transparent electrode at a second interface, wherein the first thickness of the first portion of the isolation structure is measured from the first interface to the second interface, wherein the second portion of the isolation structure contacts the second reflector electrode at a third interface, wherein the second portion of the isolation structure contacts the second transparent electrode at a fourth interface, and wherein the second thickness of the second portion of the isolation structure is measured from the third interface to the fourth interface.

3. The display device of claim 1, wherein the first portion of the isolation structure directly contacts the first reflector electrode, and wherein the second portion of the isolation structure directly contacts the second reflector electrode.

4. The display device of claim 1, wherein the first portion comprises silicon dioxide and the second portion comprises aluminum oxide.

5. The display device of claim 1, wherein the first thickness ranges between 200 angstroms and 600 angstroms or ranges between 49 angstroms and 51 angstroms.

6. A display device comprising:
   a first reflector electrode and a second reflector electrode over an interconnect structure;
   a first isolation layer comprising a pair of segments that are spaced from each other and that respectively overlie the first and second reflector electrodes, the pair of segments being made of a first dielectric material;
   a second isolation layer directly overlying the first isolation layer and the second reflector electrode, but not directly overlying the first reflector electrode, the second isolation layer being made of a second dielectric material that is different than the first dielectric material;
   a first optical emitter structure overlying the first isolation layer and the first reflector electrode and a second optical emitter structure overlying the second isolation layer and the second reflector electrode;
   a first transparent electrode directly contacting an upper surface of the second isolation layer and directly contacting a lower surface of the second optical emitter structure, the first transparent electrode having outermost vertical sidewalls that are vertically aligned with outermost sidewalls of the second optical emitter structure and are that more closely spaced than vertical outermost sidewalls of the second isolation layer; and
   a first conductive structure and a second conductive structure respectively extending from the first reflector electrode toward the first optical emitter structure and from the second reflector electrode toward the second optical emitter structure, wherein the first conductive structure extends through the first isolation layer, and wherein the second conductive structure extends through the first and second isolation layers.

7. The display device of claim 6, wherein a barrier structure separates the first conductive structure from the second conductive structure and wherein the barrier structure separates the first optical emitter structure from the second optical emitter structure.

8. The display device of claim 6, the second isolation layer comprises silicon dioxide and the first isolation layer comprises aluminum oxide.

9. The display device of claim 6, wherein the first reflector electrode has a first average surface roughness, and wherein the second reflector electrode has a second average surface roughness about equal to the first average surface roughness.

10. The display device of claim 6, wherein the first isolation layer is thinner than the second isolation layer.

11. The display device of claim 6, wherein a line continuously extends between the first and second reflector electrodes and between the pair of segments of the first isolation layer, wherein the line does not intersect the first and second reflector electrodes or the first and second isolation layers, and wherein the line extends in a first direction normal to an upper surface of the first reflector electrode.

12. A display device comprising:
a substrate;
an interconnect structure disposed over the substrate;
a first reflector electrode and a second reflector electrode having first reflector outer sidewalls arranged over the interconnect structure and spaced laterally apart from one another, the first reflector electrode and the second reflector electrode disposed at a same height as one another over the substrate;
a first optical emitter structure and a second optical emitter structure overlying the first reflector electrode and the second reflector electrode, respectively, the first optical emitter structure having vertical first optical emitter outer sidewalls;
a first isolation layer including a first segment of a first dielectric material composition and a second segment of the first dielectric material composition arranged over the first reflector electrode and the second reflector electrode, respectively, the first segment of the first dielectric material composition and the second segment of the first dielectric material composition spaced apart laterally from one another and each having a first thickness, the first segment of the first dielectric material composition having first segment vertical outer sidewalls and the second segment of the first dielectric material composition having second segment vertical outer sidewalls;
a second isolation layer of a second dielectric material composition overlying the second segment of the first dielectric material composition but not overlying the first segment of the first dielectric material composition, wherein the second dielectric material composition differs from the first dielectric material composition;
a first transparent electrode over the first segment of the first isolation layer, the first transparent electrode having vertical first transparent electrode outer sidewalls that are aligned with the vertical first optical emitter outer sidewalls;
a first conductive structure over the first reflector electrode and extending from the first reflector electrode toward the first optical emitter structure; and
a second conductive structure extending from the second reflector electrode toward the second optical emitter structure, wherein the first conductive structure extends through the first isolation layer and has a first height, and wherein the second conductive structure extends through the first and second isolation layers and has a second height greater than the first height;
wherein the vertical first transparent electrode outer sidewalls are more closely spaced than the first segment vertical outer sidewalls.

13. The display device of claim 12, wherein the first isolation layer and the second isolation layer have different thicknesses from one another.

14. The display device of claim 12, wherein the first conductive structure comprises a conductive material which lines inner sidewalls of the first isolation layer and which has a bottom surface extending laterally between the inner sidewalls of the first isolation layer.

15. The display device of claim 12, wherein the second conductive structure comprises a conductive material which lines inner sidewalls of the first isolation layer and lines inner sidewalls of the second isolation layer, wherein the second conductive structure has a bottom surface extending laterally between the inner sidewalls of the first isolation layer.

16. The display device of claim 15, further comprising:
a second transparent electrode disposed over the second isolation layer and over the second conductive structure.

17. The display device of claim 12, wherein the first isolation layer is thinner than the second isolation layer.

* * * * *